(12) United States Patent
Yao et al.

(10) Patent No.: US 12,446,265 B2
(45) Date of Patent: Oct. 14, 2025

(54) SEMICONDUCTOR DEVICES AND METHODS FOR MANUFACTURING THE SAME, AND NAND MEMORY DEVICES

(71) Applicant: YANGTZE MEMORY TECHNOLOGIES CO., LTD., Wuhan (CN)

(72) Inventors: Lan Yao, Wuhan (CN); Ziqun Hua, Wuhan (CN); Yanwei Shi, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 581 days.

(21) Appl. No.: 17/882,115

(22) Filed: Aug. 5, 2022

(65) Prior Publication Data

US 2023/0067170 A1 Mar. 2, 2023

Related U.S. Application Data

(63) Continuation of application No. PCT/CN2021/115849, filed on Aug. 31, 2021.

(51) Int. Cl.
*H10D 30/68* (2025.01)
*G11C 16/04* (2006.01)
(Continued)

(52) U.S. Cl.
CPC ..... *H10D 30/6894* (2025.01); *G11C 16/0483* (2013.01); *H01L 21/76224* (2013.01); *H10B 41/10* (2023.02); *H10B 41/35* (2023.02); *H10B 41/41* (2023.02); *H10B 43/10* (2023.02); *H10B 43/35* (2023.02); *H10B 43/40* (2023.02); *H10D 30/0411* (2025.01); *H10D 30/0413* (2025.01); *H10D 30/68* (2025.01); *H10D 30/69* (2025.01); *H10D 30/699* (2025.01);
(Continued)

(58) Field of Classification Search
None
See application file for complete search history.

(56) References Cited

U.S. PATENT DOCUMENTS

2002/0022355 A1 2/2002 Kim
2005/0051867 A1* 3/2005 Lee ............... H10B 10/12
438/296
(Continued)

FOREIGN PATENT DOCUMENTS

CN 110391245 A 10/2019
CN 110854196 A 2/2020
(Continued)

*Primary Examiner* — Mark W Tornow
(74) *Attorney, Agent, or Firm* — BAYES PLLC

(57) ABSTRACT

A semiconductor device and a method for manufacturing the same, and a NAND memory device are disclosed. The method comprises: forming a substrate that comprises a first active region and an isolation region; forming a first groove between the isolation region and the first channel region, the first groove being partially located in the isolation region, and not penetrating through the isolation region; forming a first gate insulating layer covering the first groove and the first channel region; forming a first gate on the first gate insulating layer, the first gate covering the first channel region and filling the first groove.

20 Claims, 38 Drawing Sheets

(51) Int. Cl.
  *H01L 21/762* (2006.01)
  *H10B 41/10* (2023.01)
  *H10B 41/27* (2023.01)
  *H10B 41/35* (2023.01)
  *H10B 41/41* (2023.01)
  *H10B 43/10* (2023.01)
  *H10B 43/27* (2023.01)
  *H10B 43/35* (2023.01)
  *H10B 43/40* (2023.01)
  *H10D 30/01* (2025.01)
  *H10D 30/69* (2025.01)
  *H10D 64/01* (2025.01)

(52) U.S. Cl.
  CPC ......... *H10D 64/035* (2025.01); *H10D 64/037* (2025.01); *H10B 41/27* (2023.02); *H10B 43/27* (2023.02)

(56) References Cited

U.S. PATENT DOCUMENTS

| | | | |
|---|---|---|---|
| 2009/0101941 | A1 | 4/2009 | Ellis-Monaghan et al. |
| 2010/0163970 | A1 | 7/2010 | Rakshit et al. |
| 2016/0056171 | A1* | 2/2016 | Manorotkul ...... H01L 21/02675 257/66 |
| 2021/0257491 | A1* | 8/2021 | Wei ........................ H10D 30/62 |

FOREIGN PATENT DOCUMENTS

| | | |
|---|---|---|
| CN | 111403469 A | 7/2020 |
| CN | 112071909 A | 12/2020 |
| CN | 114175217 A | 3/2022 |
| KR | 20120044552 A | 5/2012 |

\* cited by examiner

SEMICONDUCTOR DEVICES AND METHODS FOR MANUFACTURING THE SAME, AND NAND MEMORY DEVICES

CROSS-REFERENCE TO RELATED APPLICATIONS

This application is a continuation of International Application No. PCT/CN2021/115849, filed on Aug. 31, 2021, which is hereby incorporated by reference in its entirety.

TECHNICAL FIELD

The present application relates to the technical field of semiconductors, in particular to a semiconductor device and a method for manufacturing the same, and a NAND memory device.

BACKGROUND

With the technical development, the semiconductor industry continues to seek a new mode of production to allow each memory die in a memory device to have more memory cells. Currently, 3D NAND memory technique has become a relatively cutting-edge and very promising memory technology currently due to its advantages of high memory density, low cost, etc.

At present, to increase the memory density and capacity of the 3D NAND memory device, a higher memory capacity is contained in a smaller space generally by a manner of vertically stacking multiple layers of memory cells. However, with the increase of the number of stack layers in the 3D NAND memory device, increasingly high requirements are imposed onto the CMOS (Complementary Metal-Oxide Semiconductor) process, particularly in the aspect of size reduction.

Thus, how to improve the performance of a transistor device while reducing its size is a problem requiring urgent solution currently.

SUMMARY

The present application provides a semiconductor device and a method for manufacturing the same, and a NAND memory device to solve the problem that the size reduction of a transistor device affects the performance of the transistor device.

To solve the above problem, the present application provides a method for manufacturing a semiconductor device, which comprises: forming a substrate that comprises a first active region and an isolation region located on a periphery of the first active region, the first active region comprises a first source region, a first channel region and a first drain region that are connected in sequence; forming a first groove between the isolation region and the first channel region, the first groove being partially located in the isolation region, and not penetrating through the isolation region; forming a first gate insulating layer covering the first groove and the first channel region; forming a first gate on the first gate insulating layer, the first gate covering the first channel region and filling the first groove.

Forming the first groove between the isolation region and the first channel region specifically comprises forming the first groove surrounding the first active region between the isolation region and the first active region.

The substrate further comprises a shallow trench formed at the isolation region and located on a periphery of the first active region. Forming the first groove between the isolation region and the first channel region specifically comprises forming a shallow trench isolation structure in the shallow trench of the isolation region; forming the first groove between the shallow trench isolation structure and the first channel region, a depth of the first groove in a longitudinal direction perpendicular to the substrate being less than a depth of the shallow trench isolation structure in the longitudinal direction.

The substrate further comprises a second active region, the first active region and the second active region are separated by the isolation region, and the second active region comprises a second source region, a second channel region and a second drain region that are connected in sequence. Before forming the first gate on the first gate insulating layer, the method further comprises forming a second groove between the isolation region and the second channel region, the second groove being partially located in the isolation region, and not penetrating though the isolation region; forming a second gate insulating layer covering the second groove and the second channel region, a thickness of the second gate insulating layer being different from a thickness of the first gate insulating layer.

After forming the second gate insulating layer covering the second groove and the second channel region, the method further comprises forming a second gate on the second gate insulating layer, the second gate covering the second channel region and filling the second groove.

A depth of the second groove in a longitudinal direction perpendicular to the substrate is less than a depth of the first groove in the longitudinal direction.

Forming the first gate on the first gate insulating layer specifically comprises forming a gate material layer on the substrate where the first gate insulating layer is formed; removing, by etching, the gate material layer located on the first source region and the first drain region, and the gate material layer located on peripheries of the first source region and the first drain region, to obtain the first gate.

After forming the first gate on the first gate insulating layer, the method further comprises forming a sidewall on a side surface of the first gate.

To solve the above problem, the present application further provides a semiconductor device, which comprises: a substrate that comprises a first active region and an isolation region located on a periphery of the first active region, the first active region comprising a first source region, a first channel region and a first drain region that are connected in sequence; a first groove located between the isolation region and the first channel region, the first groove being partially located in the isolation region, and not penetrating through the isolation region; a first gate insulating layer covering the first groove and the first channel region; a first gate located on the first gate insulating layer, the first gate covering the first channel region and filling the first groove.

The first groove is located between the isolation region and the first active region and surrounds the first active region.

The substrate further comprises a second active region, the first active region and the second active region are separated by the isolation region, and the second active region comprises a second source region, a second channel region and a second drain region that are connected in sequence. The semiconductor device further comprises: a second groove located between the isolation region and the second channel region, the second groove being partially located in the isolation region, and not penetrating though the isolation region; a second gate insulating layer covering the second groove and the second channel region, a thickness of the second gate insulating layer being different from a thickness of the first gate insulating layer.

The semiconductor device further comprises a second gate that covers the second channel region and fills the second groove.

A depth of the second groove in a longitudinal direction perpendicular to the substrate is less than a depth of the first groove in the longitudinal direction.

To solve the above problem, the present application further provides a NAND memory device which comprises a memory array and a periphery device that are electrically connected. The memory array comprises a plurality of memory cell strings. The periphery device comprises: a substrate that comprises a first active region and an isolation region located on a periphery of the first active region, the first active region comprising a first source region, a first channel region and a first drain region that are connected in sequence; a first groove located between the isolation region and the first channel region, the first groove being partially located in the isolation region, and not penetrating through the isolation region; a first gate insulating layer covering the first groove and the first channel region; a first gate located on the first gate insulating layer, the first gate covering the first channel region and filling the first groove.

The first groove is located between the isolation region and the first active region and surrounds the first active region.

The substrate further comprises a second active region, the first active region and the second active region are separated by the isolation region, and the second active region comprises a second source region, a second channel region and a second drain region that are connected in sequence. The periphery device further comprises: a second groove located between the isolation region and the second channel region, the second groove being partially located in the isolation region, and not penetrating though the isolation region; a second gate insulating layer covering the second groove and the second channel region, a thickness of the second gate insulating layer being different from a thickness of the first gate insulating layer.

The periphery device further comprises a second gate that covers the second channel region and fills the second groove.

A depth of the second groove in a longitudinal direction perpendicular to the substrate is less than a depth of the first groove in the longitudinal direction.

The memory array further comprises a stack structure located on the periphery device, wherein each of the memory cell strings comprises a channel layer and a memory functional layer that penetrate through the stack structure, and the memory functional layer is located between the channel layer and the stack structure.

The memory array further comprises an interconnection layer disposed on one side of the stack structure facing toward the periphery device, wherein the memory cell strings are electrically connected with the interconnection layer, and the interconnection layer is electrically connected to the substrate in the first source region, the substrate in the first drain region, and/or the first gate.

The present application has the advantageous effects that the semiconductor device and the method for manufacturing the same, and the NAND memory device provided by the present application can increase effective lengths of gates to improve the control of the gates over transistor channels, and therefore, can improve electrical characteristic parameters, such as saturation current, leakage current, etc., of a transistor device and the performance of the transistor device while the size of the transistor device is reduced.

BRIEF DESCRIPTION OF THE DRAWINGS

The drawings to be used in embodiments are briefly described as follows for the purpose of illustrating the technical solutions in embodiments of the present application more clearly. Apparently, the drawings described below are only some embodiments of the present application. Those skilled in the art may obtain other drawings according to such drawings without creative work.

DETAILED DESCRIPTION

Figure 1:
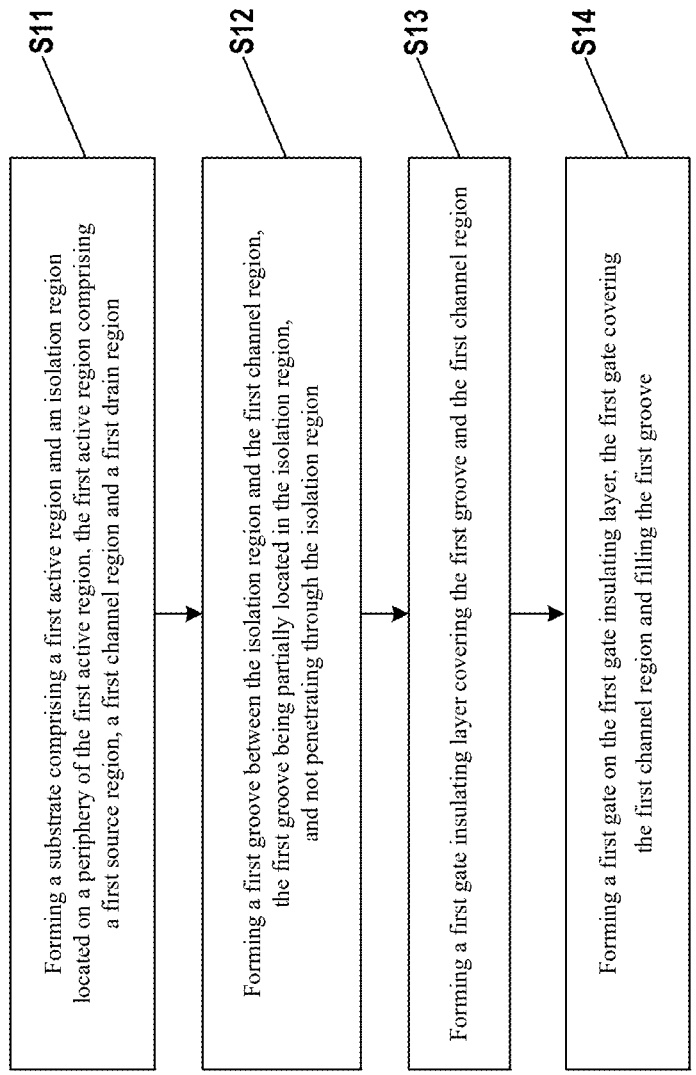
FIG. 1 is a flow diagram of a method for manufacturing a semiconductor device provided by embodiments of the present application.

The present application will be further described in detail in conjunction with the accompanying drawings and embodiments. It is specially pointed out that, embodiments below are merely used to illustrate the present application, rather than to restrict the scope of the present application. Similarly, the embodiments below are merely part but not all of embodiments of the present application. All other embodiments obtained by those of ordinary skill in the art without creative work shall fall in the protection scope of the present application.

Furthermore, the direction phraseologies as mentioned in the present application, e.g., [upper], [lower], [front], [back], [left], [right], [inside], [outside], [side], etc., are merely intended to describe the directions with reference to the accompanying drawings. Thus, the direction phraseologies are used for illustration and understanding of the present application, instead of restriction of the present application. In respective drawings, elements with similar structures are denoted by the same reference sign. For the sake of clarity, respective portions in the drawings are not drawn to scale. In addition, some well-known portions may not be shown in the drawings.

The present application may be presented in various forms, some examples therein will be described below.

Referring to FIG. 1 which is a flow diagram of a method for manufacturing a semiconductor device provided by embodiments of the present application, a specific procedure of the method for manufacturing the semiconductor device may be as follows:

Step S11: a substrate is formed, which comprises a first active region and an isolation region located on a periphery of the first active region, the first active region comprises a first source region, a first channel region and a first drain region that are connected in sequence.

In this embodiment, the semiconductor device may specifically be a semiconductor device having at least one transistor, wherein the transistor may specifically be a metal oxide semiconductor field-effect transistor (MOSFET). Specifically, the number of the first active region may be one or more, and each first active region may correspondingly be an active region of one transistor in the semiconductor device. Accordingly, in each first active region, the substrate in the first source region, the substrate in the first channel region, and the substrate in the first drain region may correspondingly be a source, a channel and a drain of one transistor in the semiconductor device, respectively.

Figure 2:
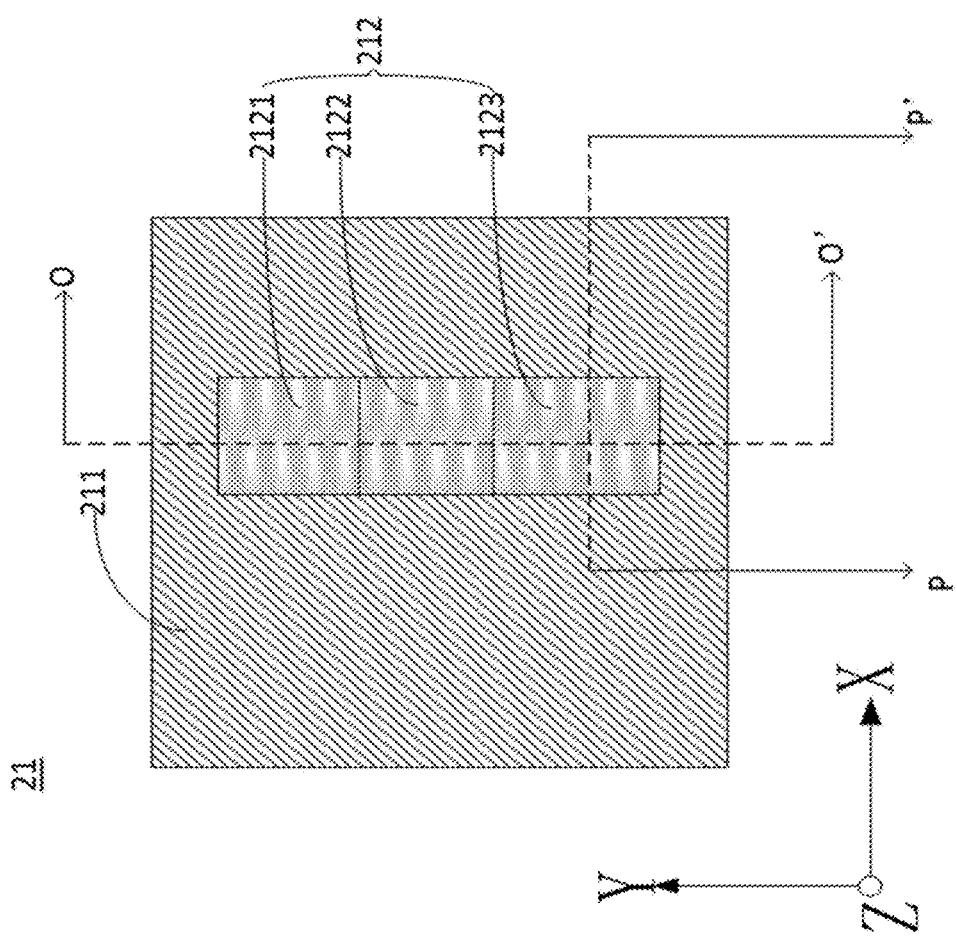
FIG. 2 is a top-down structural diagram of a substrate provided by embodiments of the present application.
Figure 3:
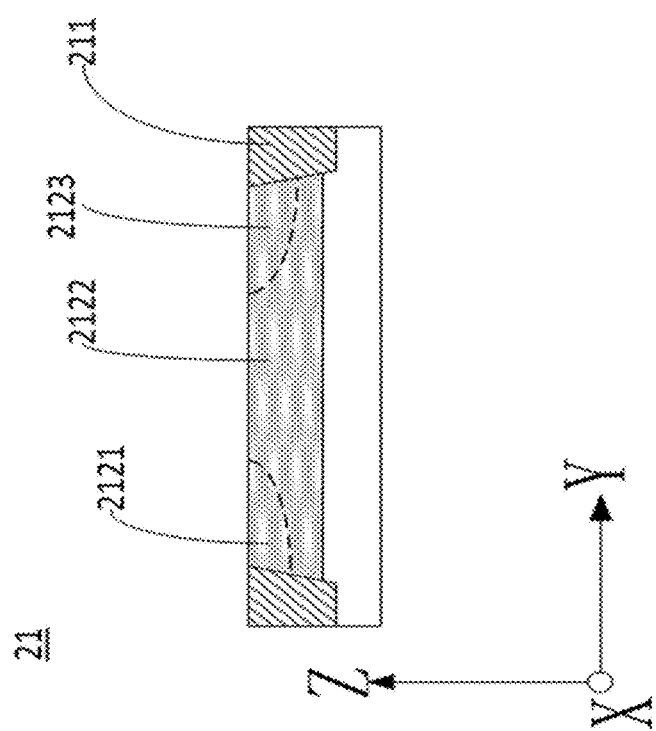
FIG. 3 is a structural view of a cross section taken along a line O-O' in FIG. 2.
Figure 4:
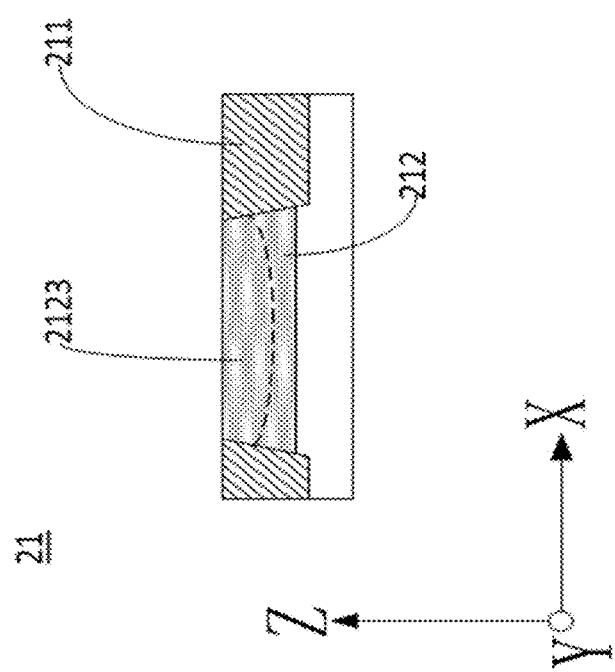
FIG. 4 is a structural view of a cross section taken along a line P-P' in FIG. 2.

Specifically, as shown in FIGS. 2, 3 and 4, the first active region 212 may be located at a top of the substrate 21, and in the first active region 212, the first source region 2121 and the first drain region 2123 may be located at two opposite ends (e.g., two opposite ends of a top) of the first active region 212 respectively, the first channel region 2122 may correspondingly be an region located between the first source region 2121 and the first drain region 2123 in the first active region 212.

Moreover, during specific implementation, P-type doping may be performed for an initial active region of an initial substrate to form an intermediate active region, and then N-type doping is performed for the two opposite ends of the intermediate active region to form the first active region 212. In other embodiments, alternatively, N-type doping may be performed for an initial active region of an initial substrate to form an intermediate active region, and then P-type doping is performed for the two opposite ends of the intermediate active region to form the first active region 212. The initial substrate is a substrate 21 before formation of the first active region 212, and specifically may be a semiconductor substrate such as a silicon (Si) substrate, a germanium (Ge) substrate, a SiGe substrate, a Silicon On Insulator (SOI) substrate, or a Germanium On Insulator (GOI) substrate, etc.

In this embodiment, as shown in FIGS. 2, 3 and 4, the isolation region 211 may be used for electrically isolating the first active region 212 from other structures (e.g., other active regions) on the periphery of the first active region 212 in order for subsequent independent control of a transistor formed on the basis of the first active region 212. Moreover, when there are a plurality of first active regions 212, the plurality of first active regions 212 may be disposed at intervals, and are separated by the isolation region 211 to guarantee electrical isolation between active regions of different transistors in the semiconductor device.

Specifically, both the isolation region 211 and the first active region 212 may be located at the top of the substrate 21, and a depth of the isolation region 211 in a longitudinal direction Z perpendicular to the substrate 21 is not less than a depth of the first active region 212 in the longitudinal direction Z. In some embodiments, as shown in FIGS. 3 and 4, a cross section width of the first active region 212 may gradually increase from the top down; specifically, a cross section of the first active region 212 may be in a shape of an isosceles trapezoid.

Step S12: a first groove is formed between the isolation region and the first channel region, the first groove is partially located in the isolation region and does not penetrate through the isolation region.

Figure 5:
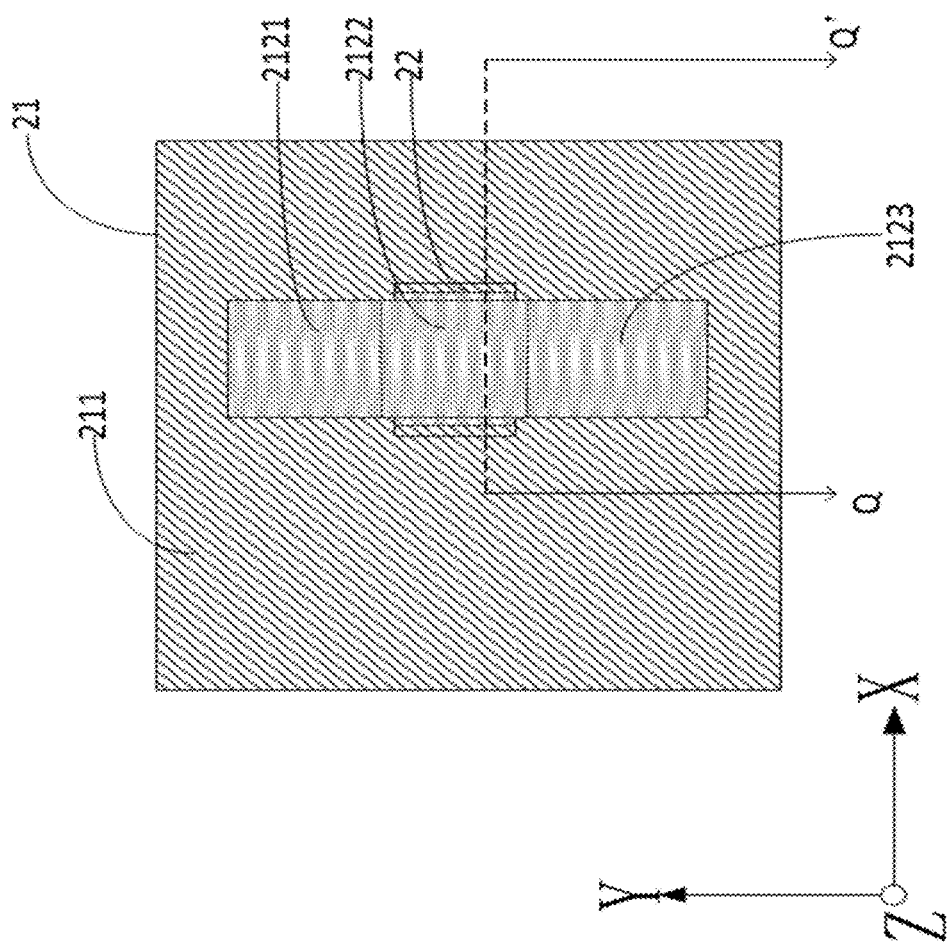
FIG. 5 is a top-down structural diagram after completion of Step S12, provided by embodiments of the present application.
Figure 6:
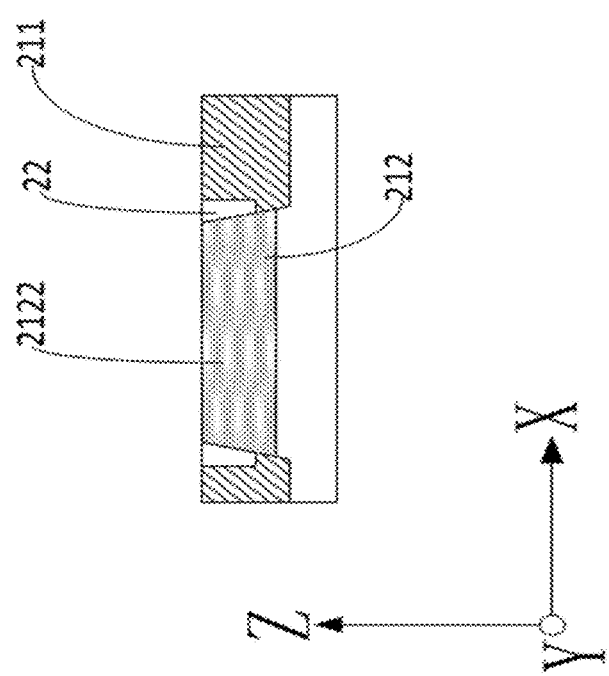
FIG. 6 is a structural view of a cross section taken along a line P-P' in FIG. 5.
Figure 7:
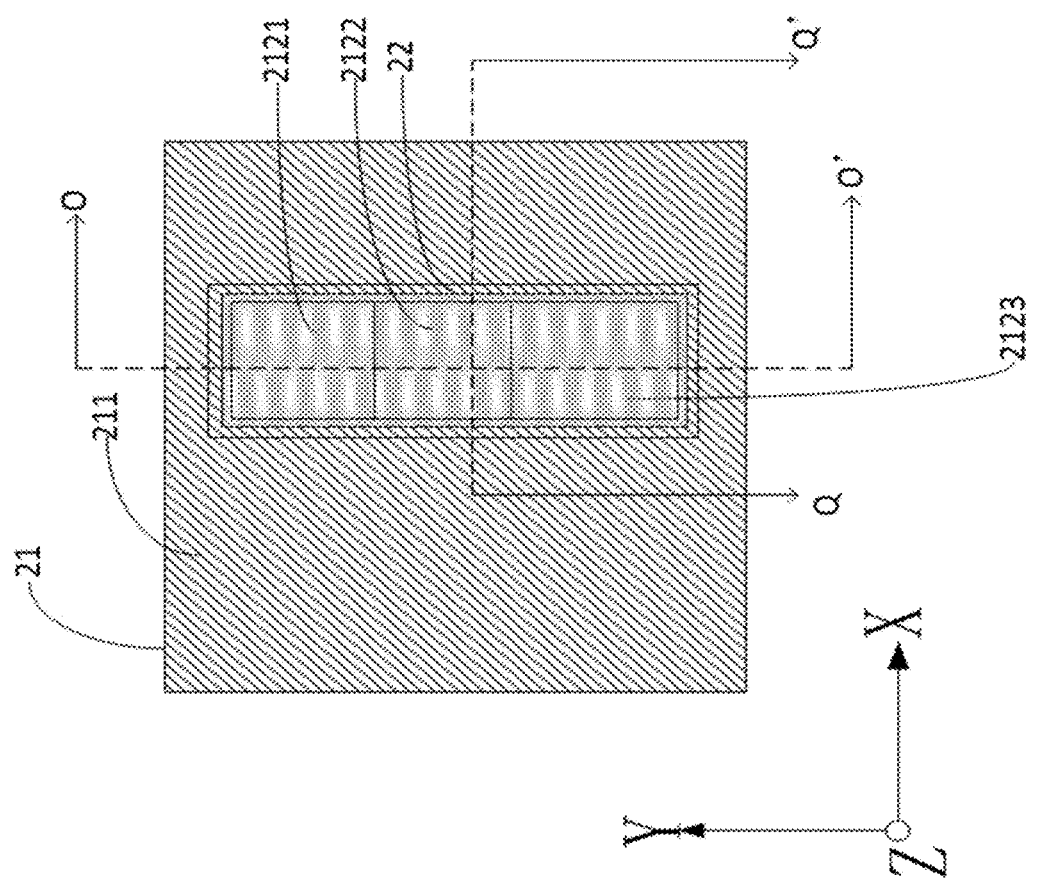
FIG. 7 is another top-down structural diagram after completion of Step S12, provided by embodiments of the present application.
Figure 8:
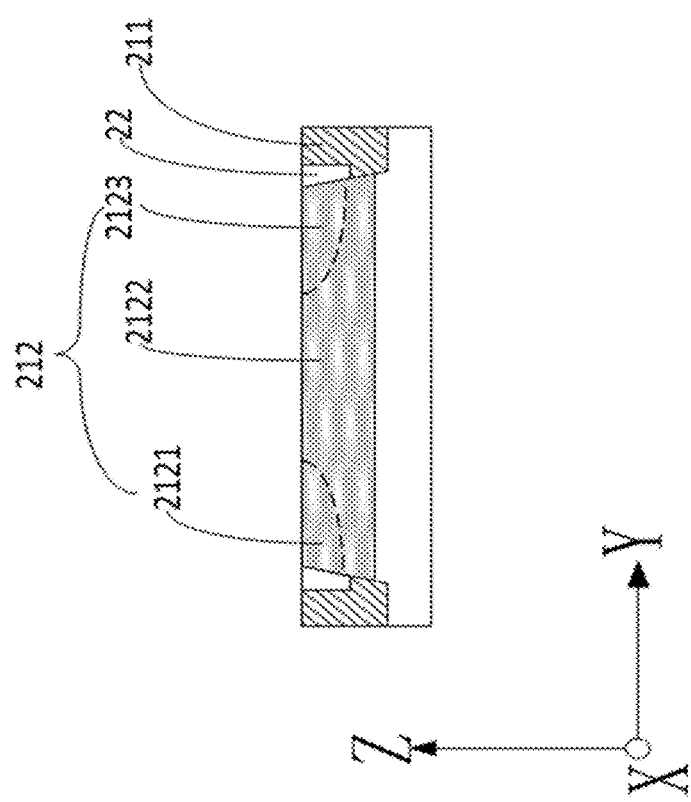
FIG. 8 is a structural view of a cross section taken along a line O-O' in FIG. 7.
Figure 9:
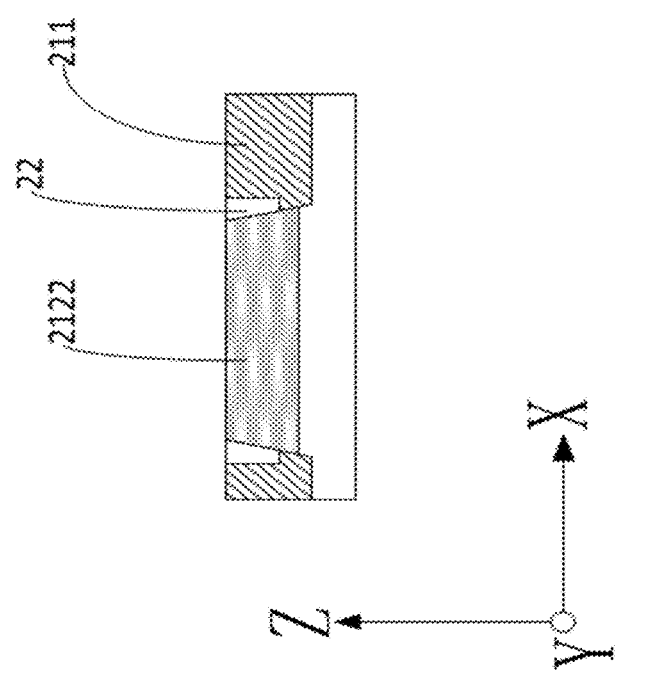
FIG. 9 is a structural view of a cross section taken along a line Q-Q' in FIG. 7.

A structural diagram after the completion of Step S12 is as shown in FIGS. 5 and 6, or in FIGS. 7, 8 and 9.

In an embodiment, as shown in FIGS. 5 and 6, the first groove 22 may be only formed at a first juncture region where the isolation region 211 is connected with the first channel region 2122 to only separate a top end of the isolation region 211 from a top end of the first channel region 2122. In other embodiments, as shown in FIGS. 7, 8 and 9, besides the first juncture region where the isolation region 211 is connected with the first channel region 2122, the first groove 22 may also be formed at a juncture region where the isolation region 211 is connected with the first source region 2121, and/or a juncture region where the isolation region 211 is connected with the first drain region 2123.

For example, as shown in FIGS. 7, 8 and 9, the first groove 22 may surround the first active region 212 by a cycle to completely separate the top end of the isolation region 211 from a top end of the first active region 212. Accordingly, Step S12 may specifically be: the first groove 22 surrounding the first active region 212 is formed between the isolation region 211 and the first active region 212, wherein the top end of the isolation region 211 is separated from the top end of the first active region 212 by the first groove 22 to obtain the first groove 22 formed at the first juncture region where the isolation region 211 is connected with the first channel region 2122.

In one specific embodiment, Step S12 may specifically comprise:

Step S121: a shallow trench isolation structure is formed in a shallow trench of the isolation region.

Step S122: a first groove is formed between the shallow trench isolation structure and the first channel region, a depth of the first groove in a longitudinal direction perpendicular to the substrate is less than a depth of the shallow trench isolation structure in the longitudinal direction.

Figure 11:
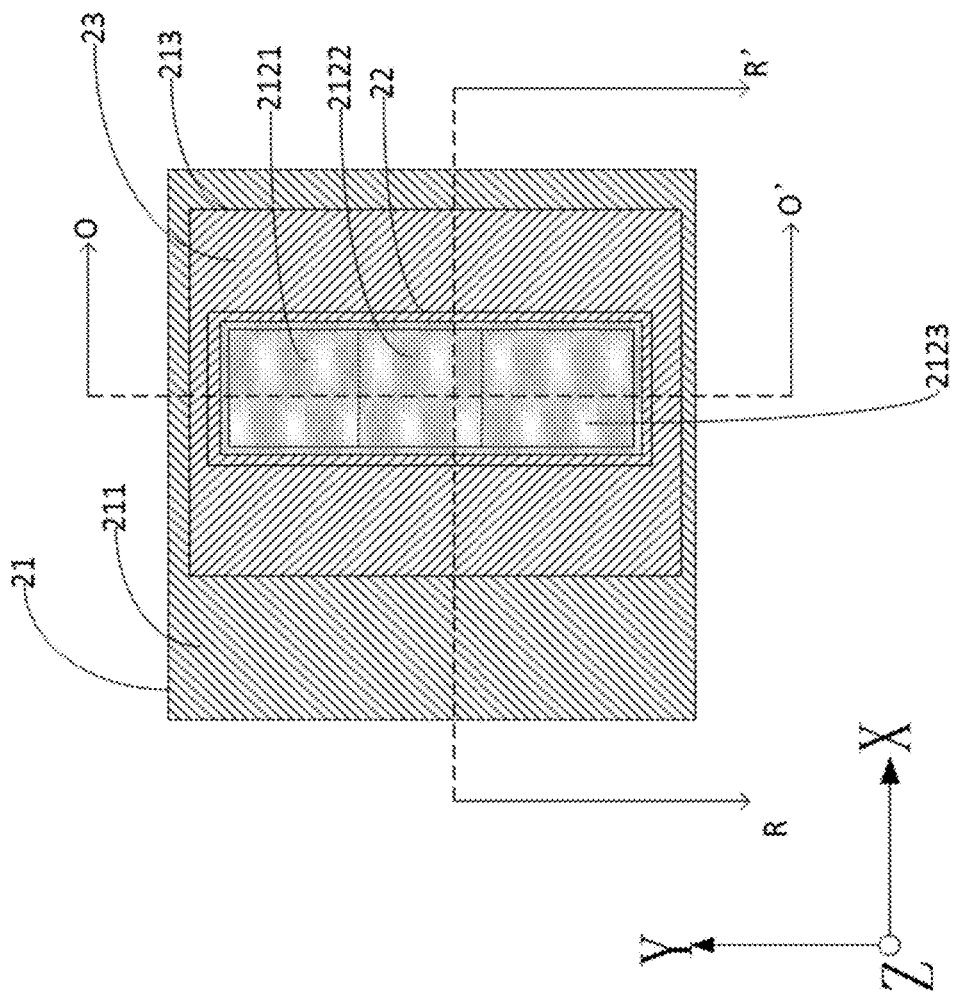
FIG. 11 is a top-down structural diagram after completion of Step S122, provided by embodiments of the present application.
Figure 12:
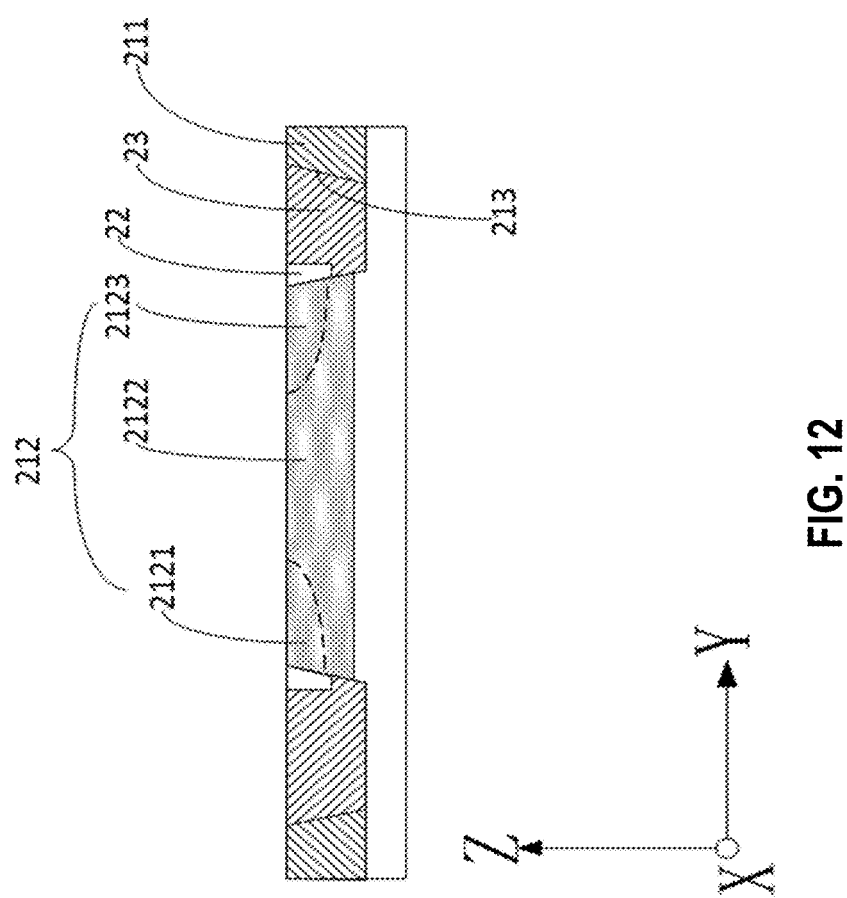
FIG. 12 is a structural view of a cross section taken along a line O-O' in FIG. 11.
Figure 13:
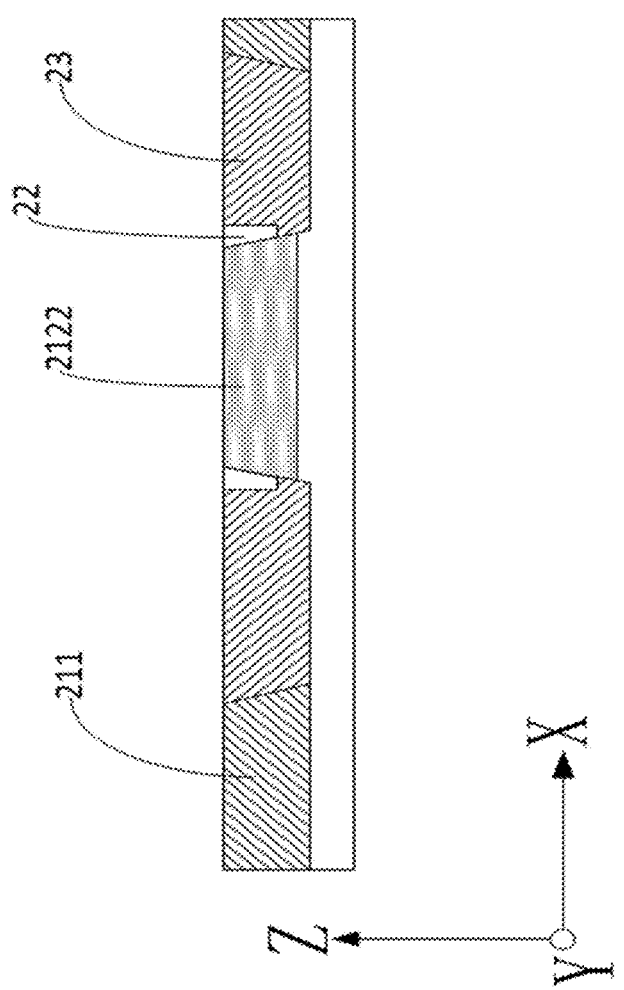
FIG. 13 is a structural view of a cross section taken along a line R-R' in FIG. 11.

A structural diagram after the completion of Step S122 is as shown in FIGS. 11, 12 and 13.

The substrate 21 may further comprise a shallow trench 213 that is formed at the isolation region 211 and located on the periphery of the first active region 212. The shallow trench 213 is used for isolating the first active region 212 from other structures located on the periphery of the first active region 212 in order for subsequent independent control of a transistor formed on the basis of the first active region 212. Moreover, during specific implementation, the shallow trench 213 may be formed by etching part of the substrate 21 in the isolation region 211, and then the shallow trench 213 is filled with an insulating material (e.g., silicon oxide) to obtain the trench isolation structure 23.

In some embodiments, the shallow trench 213 may be located at the top of the substrate 21, and a depth of the shallow trench 213 in the longitudinal direction Z perpendicular to the substrate 21 is not less than a depth of the first active region 212 in the longitudinal direction Z.

In some specific embodiments, as shown in FIGS. 11, 12 and 13, a side wall of the shallow trench 213 may be a bevel, and a top size of the shallow trench 213 may be larger than a bottom size thereof. Accordingly, a side wall of the shallow trench isolation structure 23 may be also a bevel, and a top size of the shallow trench isolation structure 23 may be also larger than a bottom size thereof.

In one specific embodiment, besides the first juncture region where the shallow trench isolation structure 23 is connected with the first channel region 2122, the first groove 22 may be also formed at a juncture region where the shallow trench isolation structure 23 is connected with the first source region 2121, and/or a juncture region where the isolation region 211 is connected with the first drain region 2123.

For example, as shown in FIGS. 11, 12 and 13, the shallow trench isolation structure 23 may surround the first active region 212 by a cycle. Accordingly, Step S122 may specifically be: a first groove 22 surrounding the first active region 212 is formed between the shallow trench isolation structure 23 and the first active region 212, and the top end of the shallow trench isolation structure 23 is completely separated from the top end of the first active region 212 by the first groove 22 to obtain the first groove 22 formed at the first juncture region where the shallow trench isolation structure 23 is connected with the first channel region 2122.

In one specific embodiment, to form the first groove 22, Step S122 may specifically comprise:

Step S1221: a hard mask layer and a photoresist layer which cover the shallow trench isolation structure and the first channel region are formed on the substrate in sequence.

Step S1222: exposure and development are performed to pattern the photoresist layer.

Step S1223: the hard mask layer is etched according to the patterned photoresist layer to obtain a patterned hard mask layer.

Figure 14:
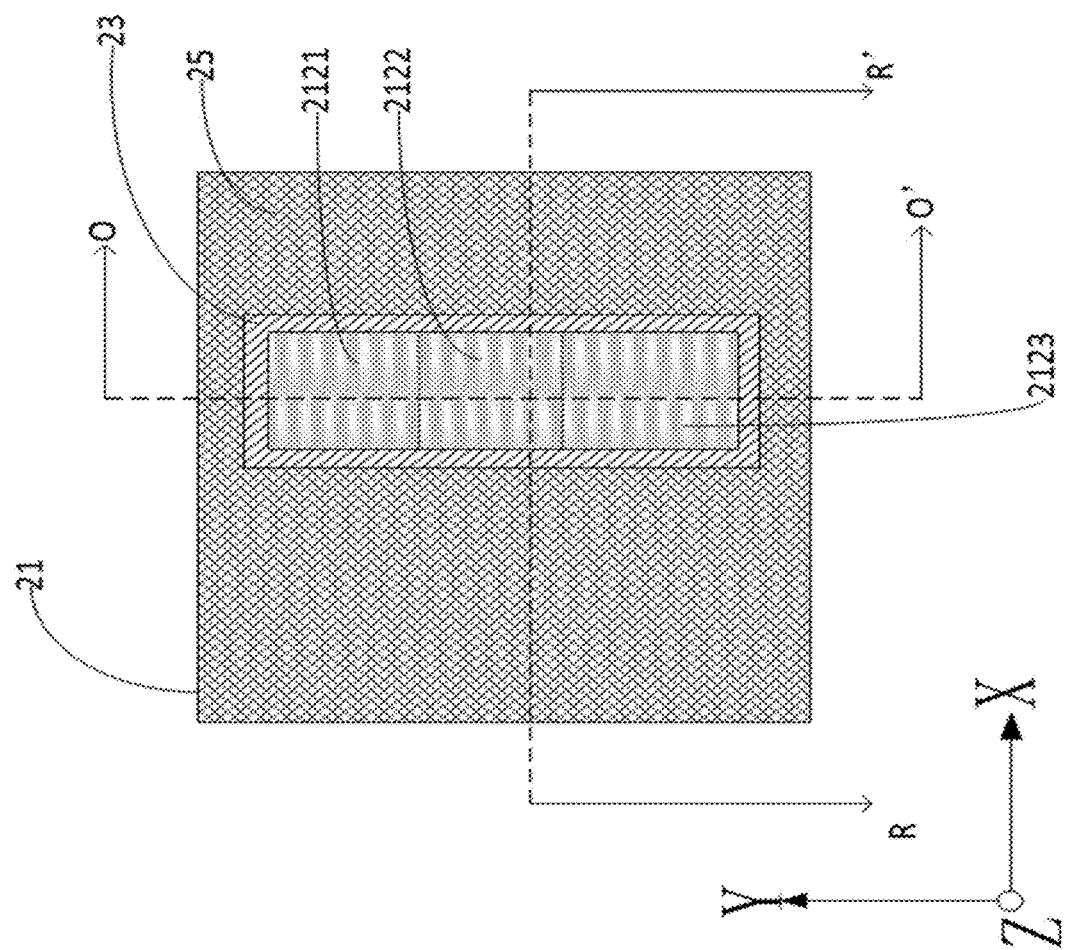
FIG. 14 is a top-down structural diagram after completion of Step S1223, provided by embodiments of the present application.
Figure 15:
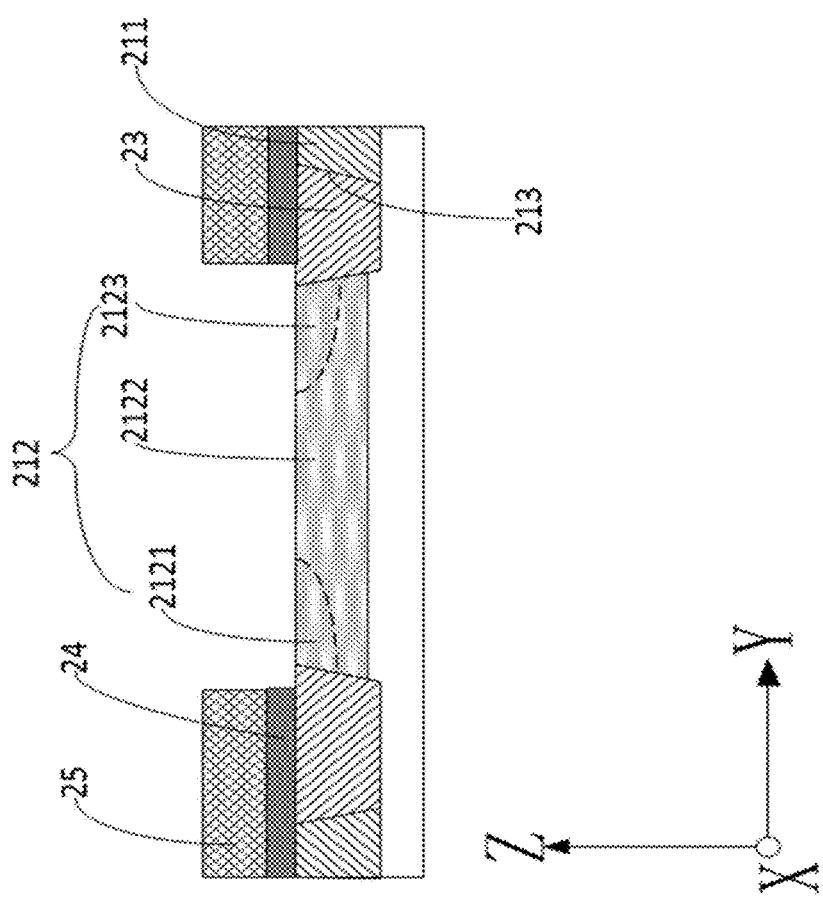
FIG. 15 is a structural view of a cross section taken along a line O-O' in FIG. 14.
Figure 16:
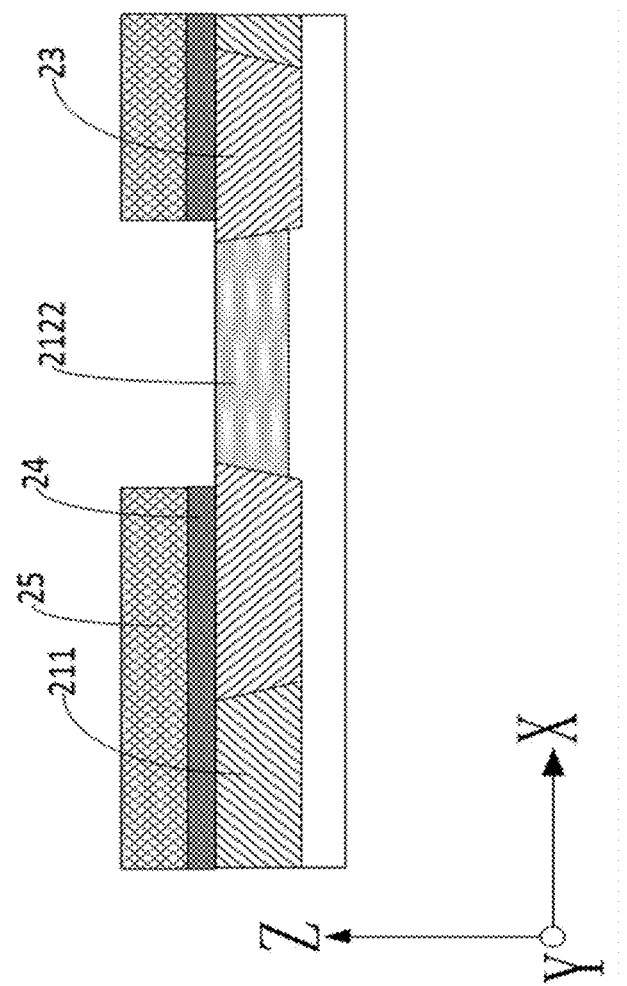
FIG. 16 is a structural view of a cross section taken along a line R-R' in FIG. 14.

A structural diagram after the completion of Step S1223 is as shown in FIGS. 14, 15 and 16.

Specifically, the patterned hard mask layer 24 may comprise an opening, and the opening is used to at least expose the first juncture region where the shallow trench isolation structure 23 is connected with the first channel region 2122. For example, as shown in FIGS. 14, 15 and 16, the opening may be used to fully expose the first juncture region where the shallow trench isolation structure 23 is connected with the first active region 212.

Step S1224: the trench isolation structure is etched according to the patterned hard mask layer to form the first groove.

Figure 17:
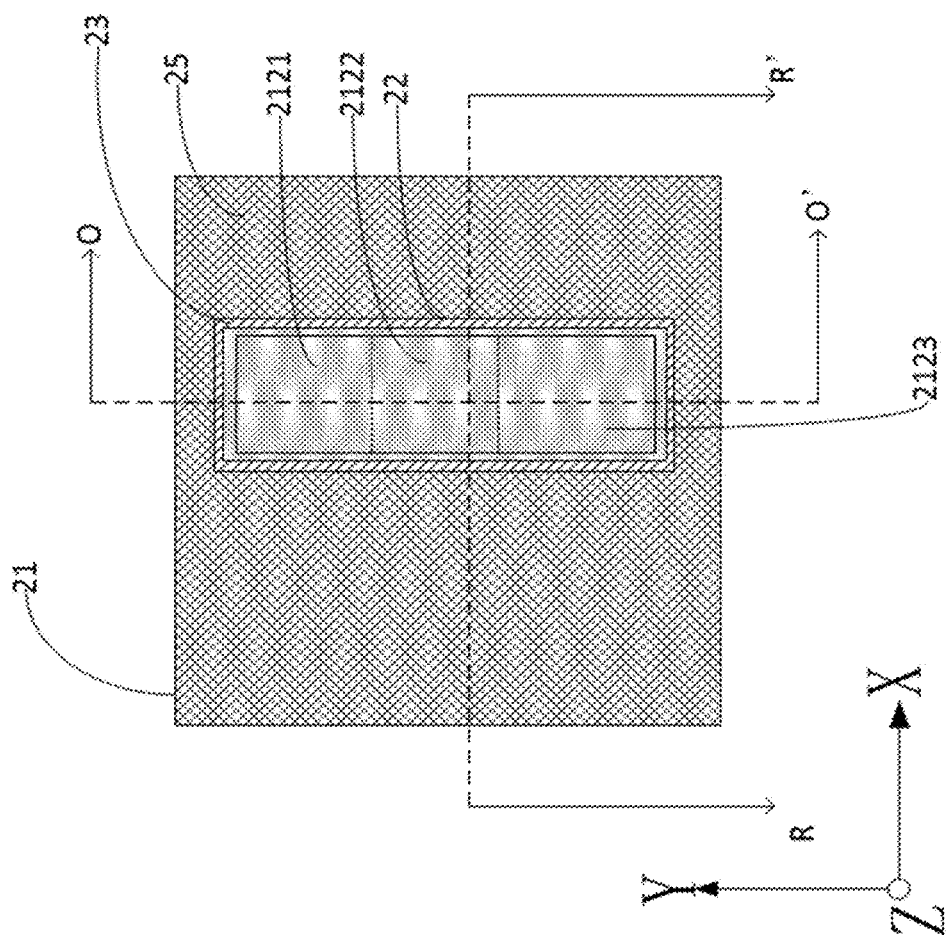
FIG. 17 is a top-down structural diagram after completion of Step S1224, provided by embodiments of the present application.
Figure 18:
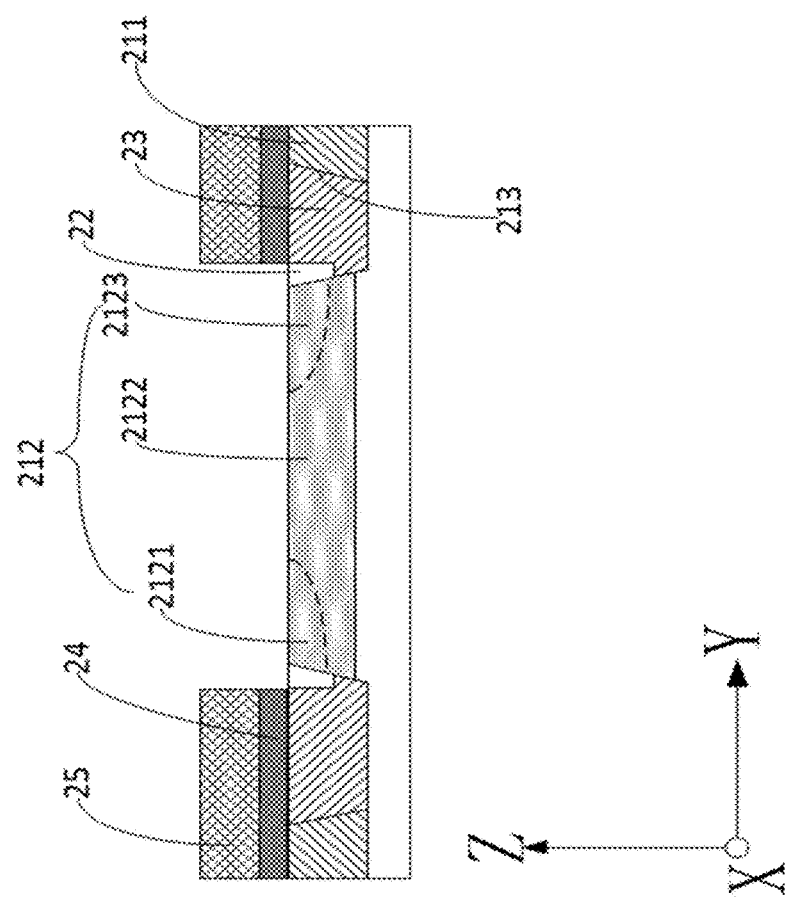
FIG. 18 is a structural view of a cross section taken along a line O-O' in FIG. 17.
Figure 19:
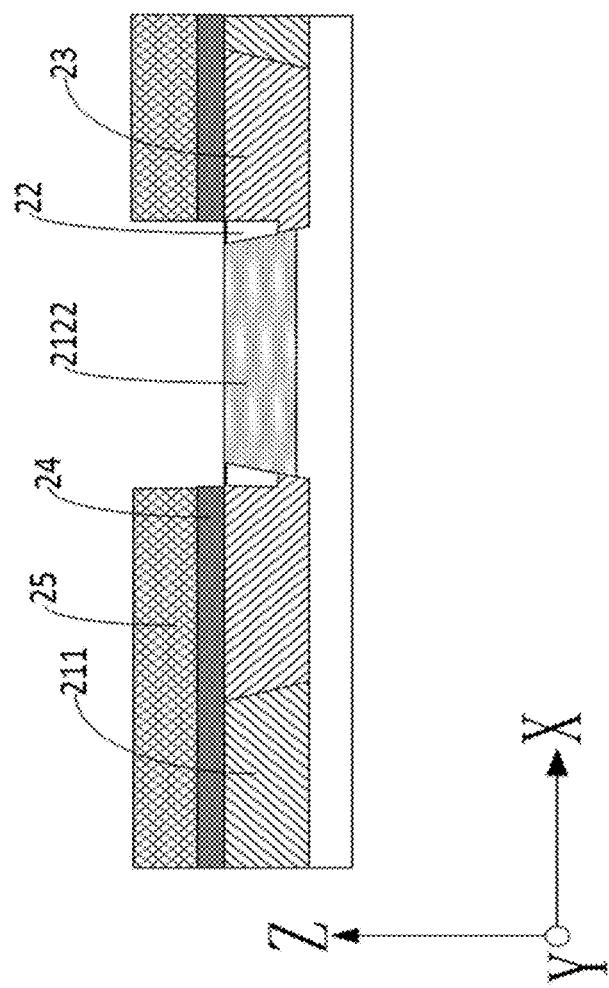
FIG. 19 is a structural view of a cross section taken along a line R-R' in FIG. 17.

A structural diagram after the completion of Step S1224 is as shown in FIGS. 17, 18 and 19.

Specifically, the shallow trench isolation structure 23 in the first juncture region exposed by the opening in the patterned hard mask layer 24 may be etched selectively to obtain the first groove 22 only located between the shallow trench isolation structure 23 and the first channel region 2122, or the first groove 22 surrounding the first active region 212 by a cycle.

Moreover, during specific implementation, the shallow trench isolation structure 23 exposed by the opening may be selectively etched by an anisotropic etching process such as a dry etching process (e.g., a plasma etching process, a reactive ion etching process, etc.). In other embodiments, the shallow trench isolation structure 23 exposed by the opening may be etched by an isotropic etching process such as a wet etching process to obtain the first groove 22. It may be understood that, in a course of performing etching using the isotropic etching process to form the first groove 22, the active region 212 of the substrate 21 and the patterned hard mask layer 24 have a certain etching selectivity relative to the shallow trench isolation structure 23 to protect the first active region 212 exposed by the opening and the rest shallow trench isolation structure 23 covered by the patterned hard mask layer 24 from reacting with an etchant to be damaged.

In some specific embodiments, in addition to the first juncture region, the opening may also expose the rest first channel region 2122 or the rest first active region 212 to reduce the etching process difficulty for patterning the hard mask layer 24 and the photoresist layer 25.

Step S13: a first gate insulating layer covering the first groove and the first channel region is formed.

Figure 20:
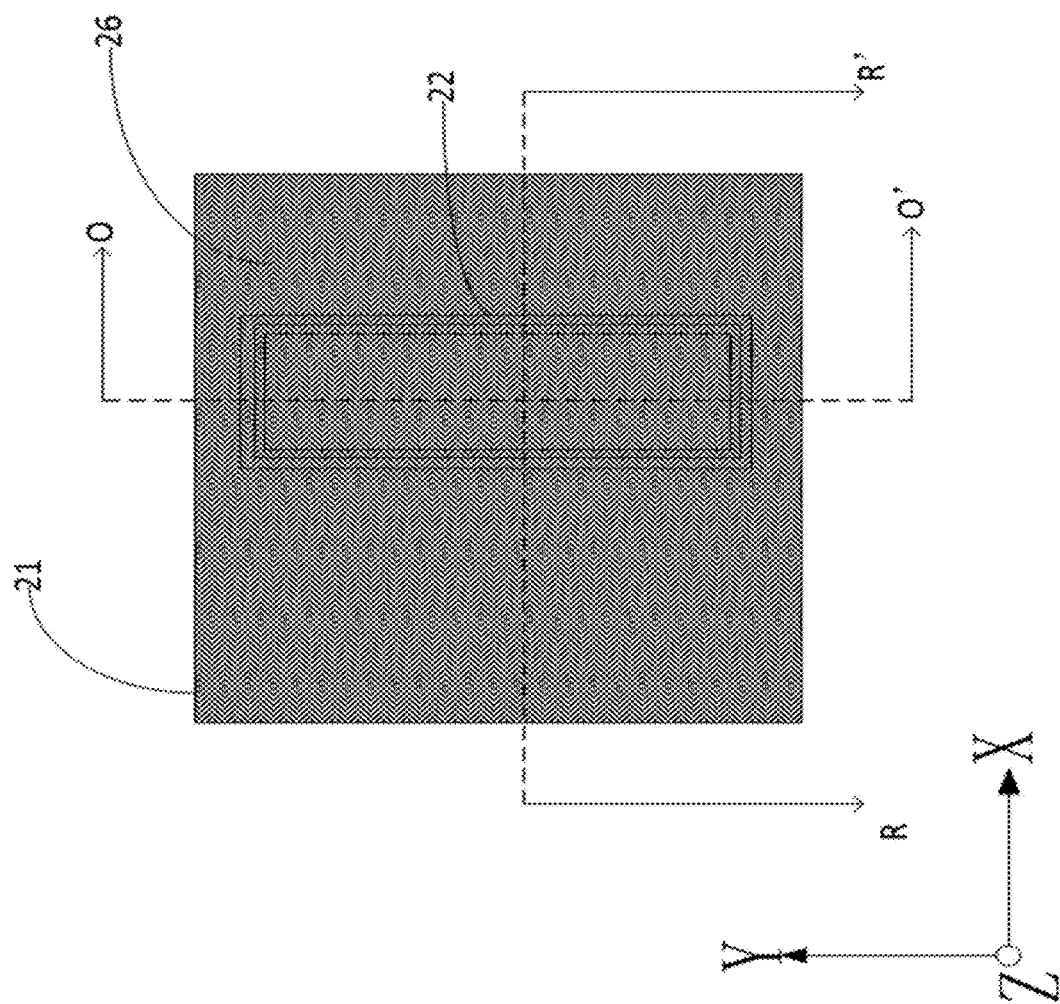
FIG. 20 is a top-down structural diagram after completion of Step S13, provided by embodiments of the present application.
Figure 21:
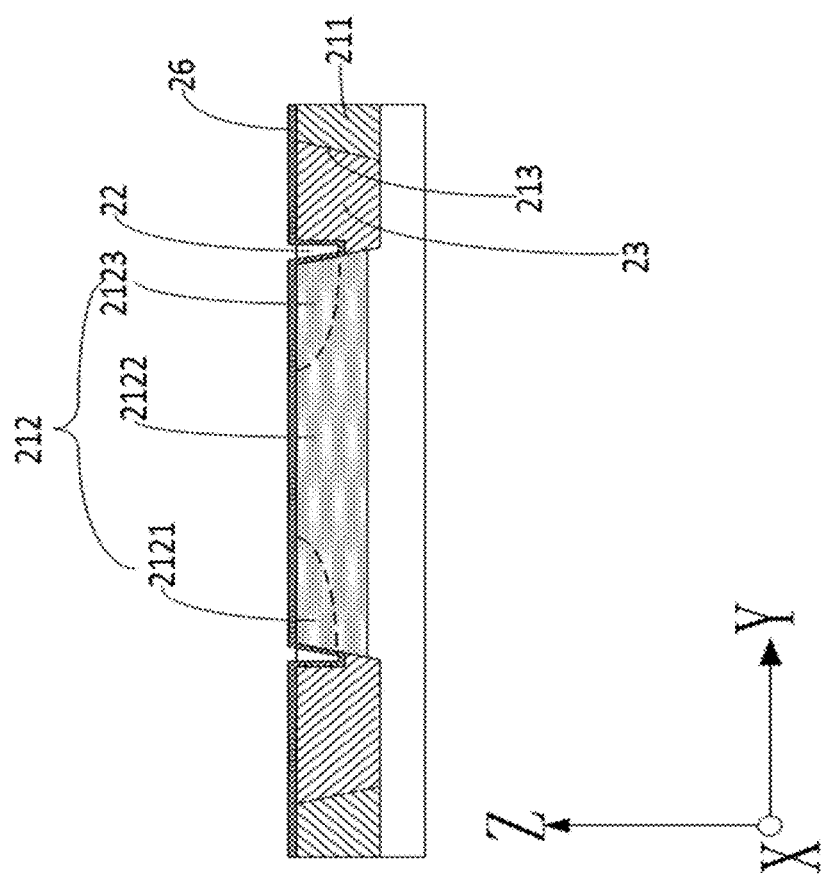
FIG. 21 is a structural view of a cross section taken along a line O-O' in FIG. 20.
Figure 22:
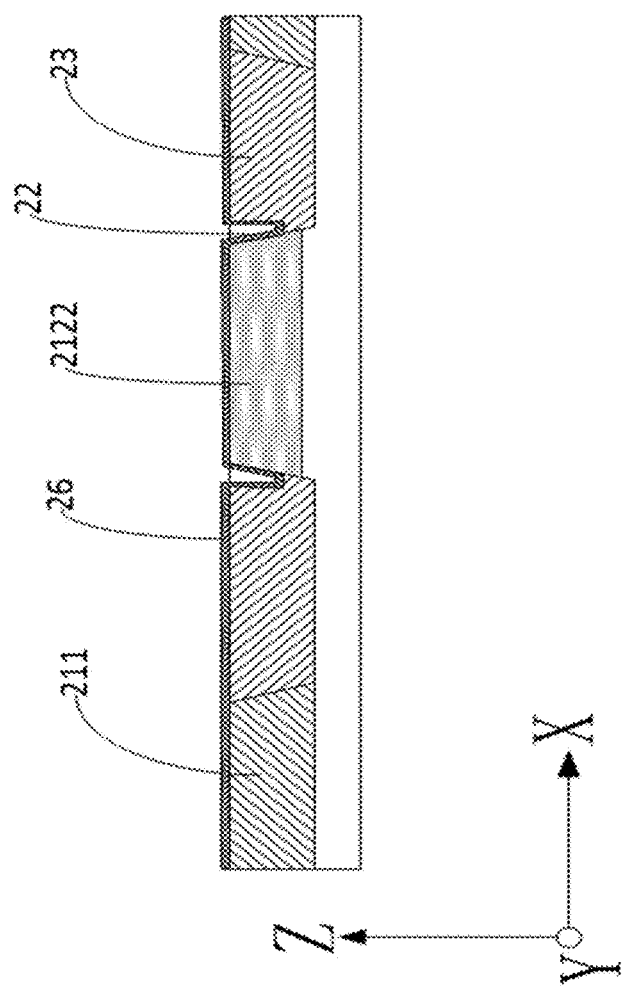
FIG. 22 is a structural view of a cross section taken along a line R-R' in FIG. 20.

A structural diagram after the completion of Step S13 is as shown in FIGS. 20, 21 and 22.

The first gate insulating layer 26 is used for electrically isolating a gate and a channel in the transistor formed on the basis of the first active region 212. Specifically, the first gate insulating layer 26 (e.g., a silicon oxide layer) at least covering the first groove 22 and the first channel region 2122 may be deposited on the substrate 21 by a method such as physical vapor deposition, chemical vapor deposition, atomic layer deposition, laser-assisted deposition, etc.

Moreover, during specific implementation, the first gate insulating layer 26 may further cover the rest top surfaces of the shallow trench isolation structure 23 and the substrate 21, in addition to an inner wall surface of the first groove 22 and the first channel region 2122.

Step S14: a first gate is formed on the first gate insulating layer, the first gate covers the first channel region and fills the first groove.

Figure 10:
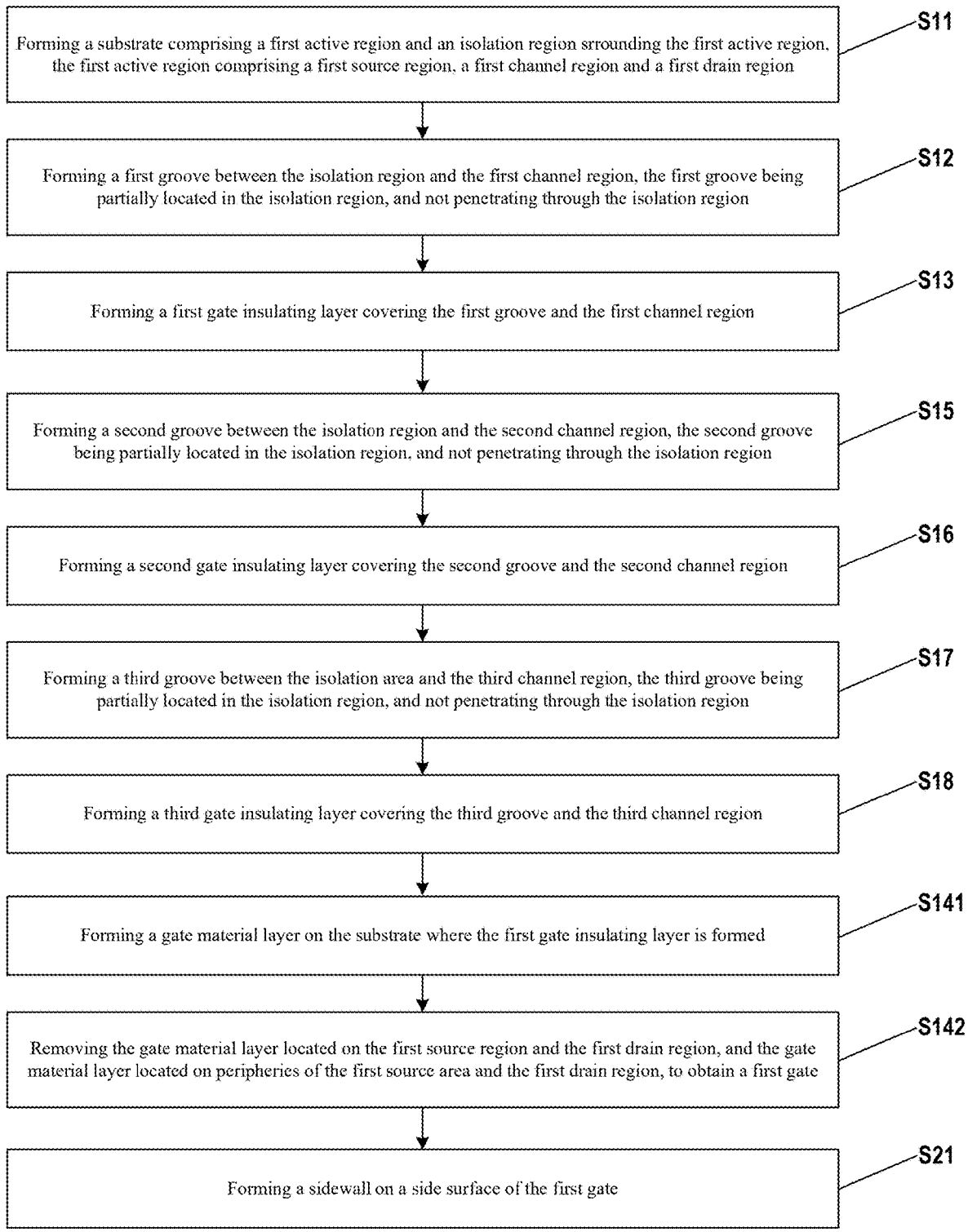
FIG. 10 is another flow diagram of a method for manufacturing a semiconductor device provided by embodiments of the present application.

In one specific embodiment, as shown in FIG. 10, Step S14 may specifically comprise:

Step S141: a gate material layer is formed on the substrate where the first gate insulating layer is formed.

Figure 23:
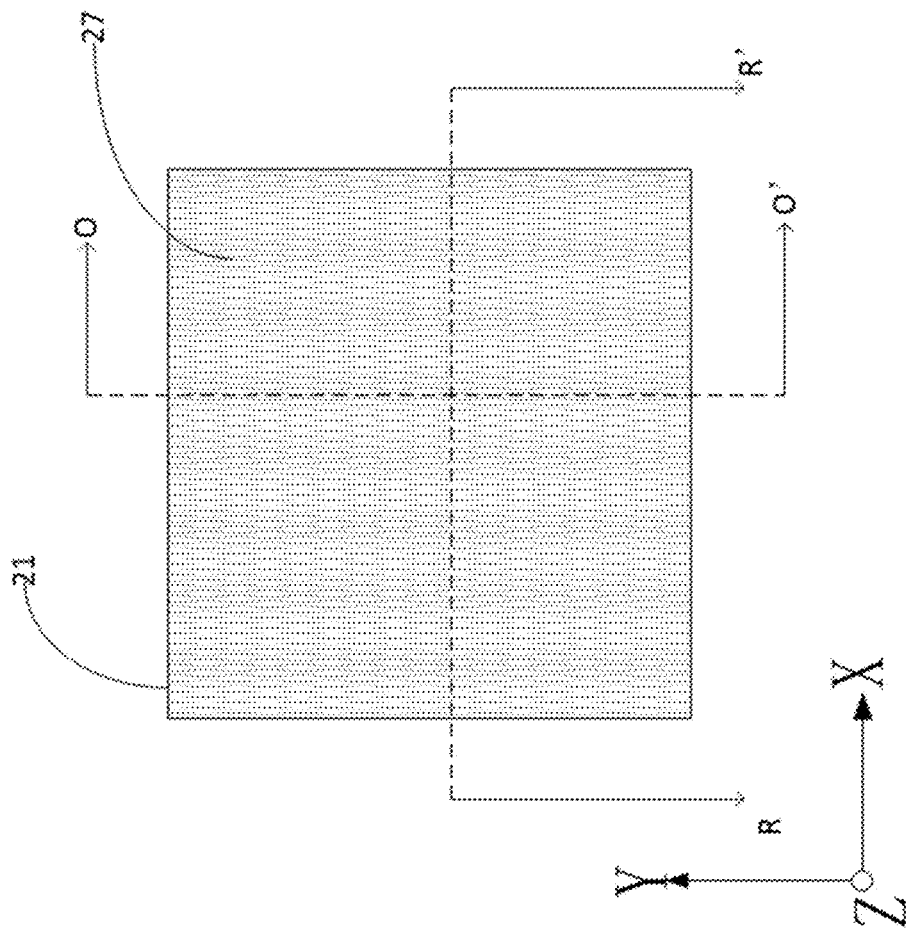
FIG. 23 is a top-down structural diagram after completion of Step S141, provided by embodiments of the present application.
Figure 24:
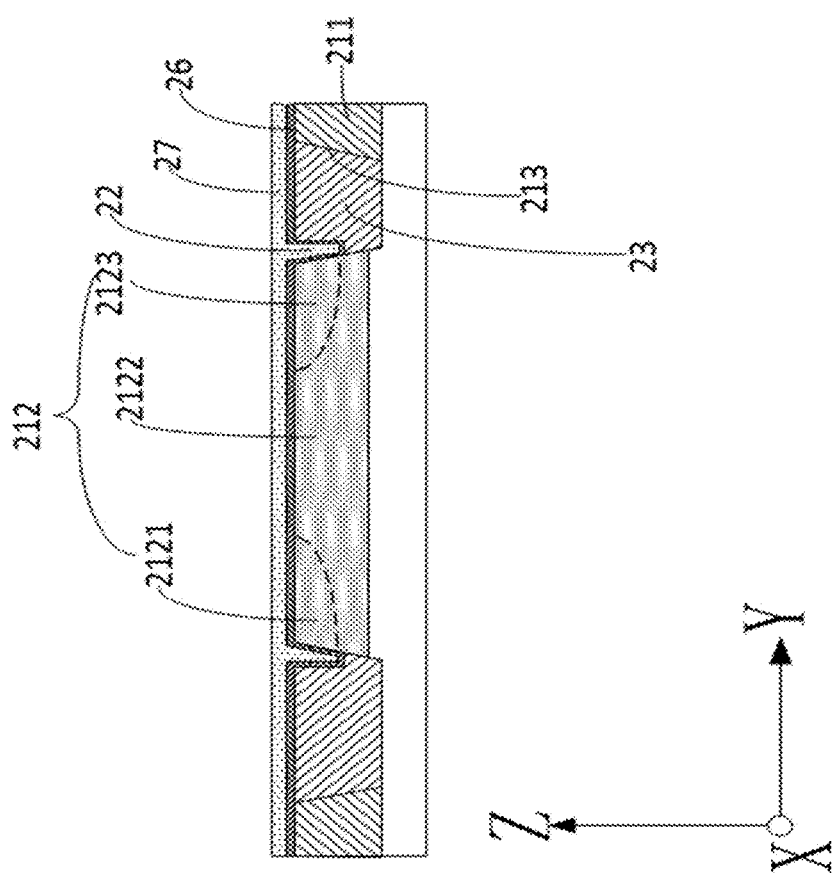
FIG. 24 is a structural view of a cross section taken along a line O-O' in FIG. 23.
Figure 25:
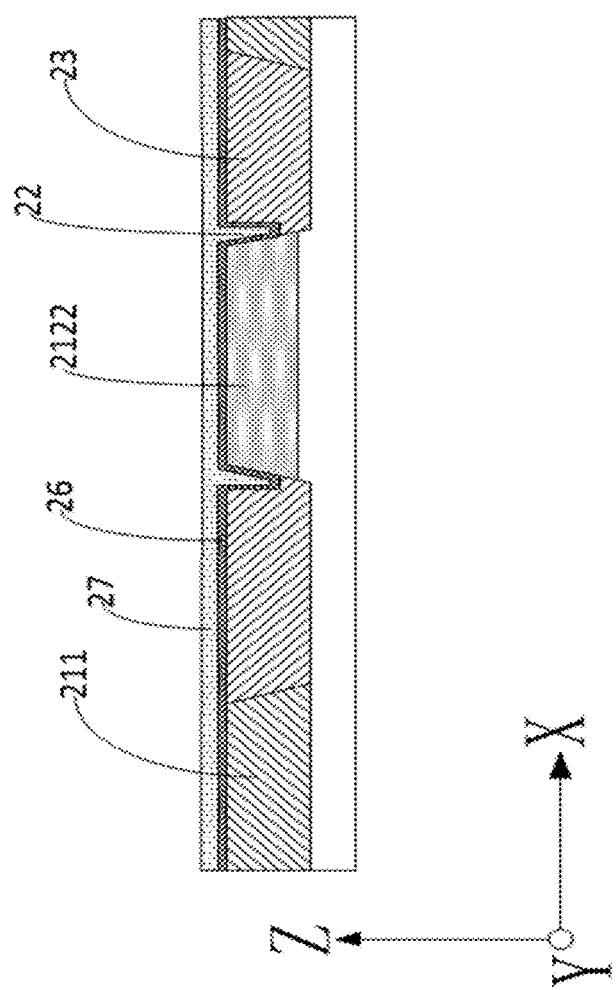
FIG. 25 is a structural view of a cross section taken along a line R-R' in FIG. 23.

A structural diagram after the completion of Step S141 is as shown in FIGS. 23, 24 and 25.

Specifically, a layer of gate material (e.g., polysilicon) may be deposited on the substrate 21 where the first gate insulating layer 26 is formed, to obtain the gate material layer 27. Moreover, in a deposition process of the gate material, the rest space in the first groove 22 is filled with the gate material.

Step S142: the gate material layer located on the first source region and the first drain region, and the gate material layer located on peripheries of the first source region and the first drain region are removed by etching, to obtain the first gate.

Step S142 may specifically comprise:

Step S1421: a hard mask layer and a photoresist layer are formed on the gate material layer in sequence.

Step S1422: exposure and development are performed to pattern the photoresist layer.

Step S1423: the hard mask layer is etched according to the patterned photoresist layer to obtain a patterned hard mask layer.

Step S1224: the gate material layer is etched according to the patterned hard mask layer to obtain a gate layer having the first gate.

Figure 26:
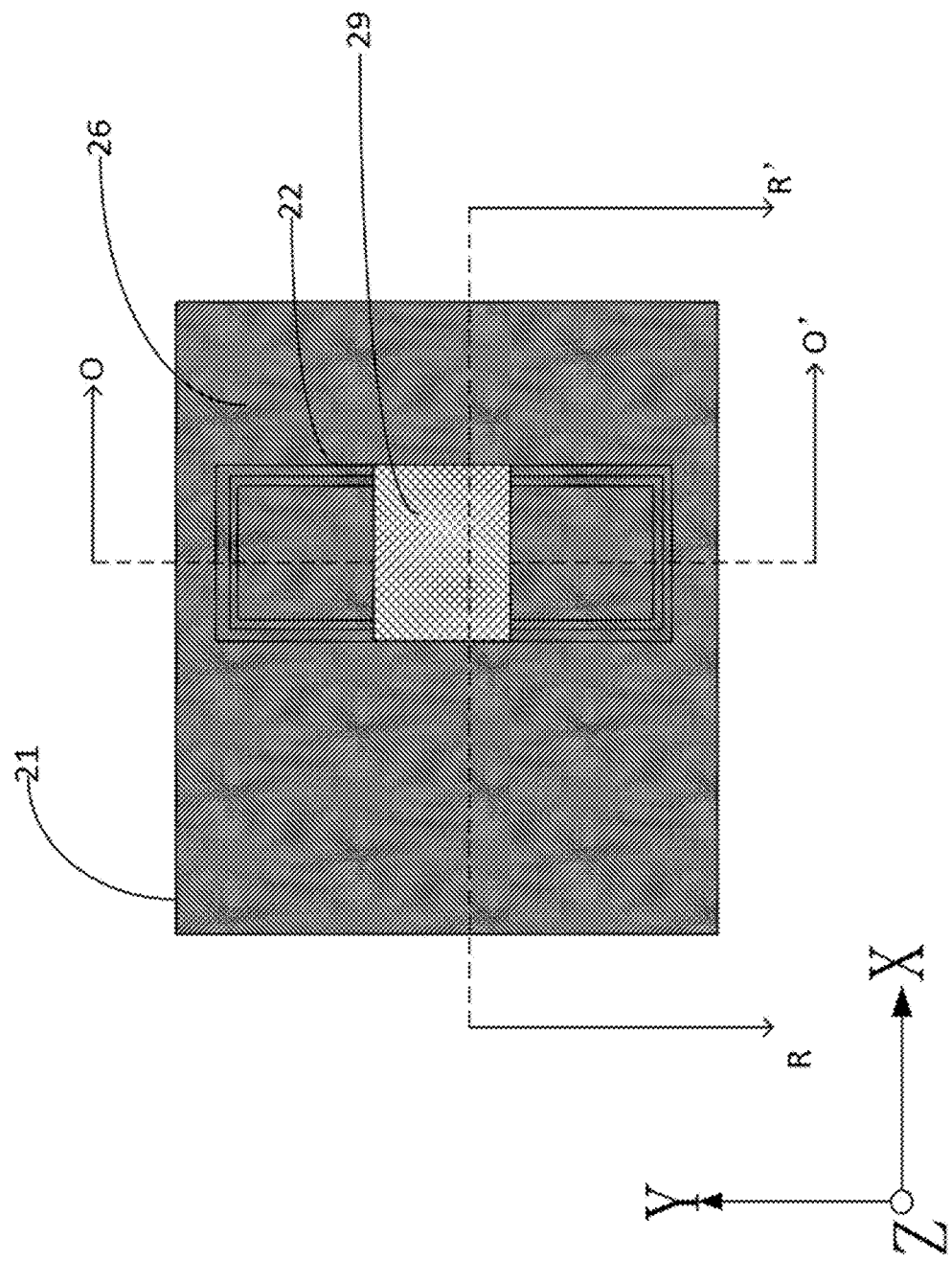
FIG. 26 is a top-down structural diagram after completion of Step S1423, provided by embodiments of the present application.
Figure 27:
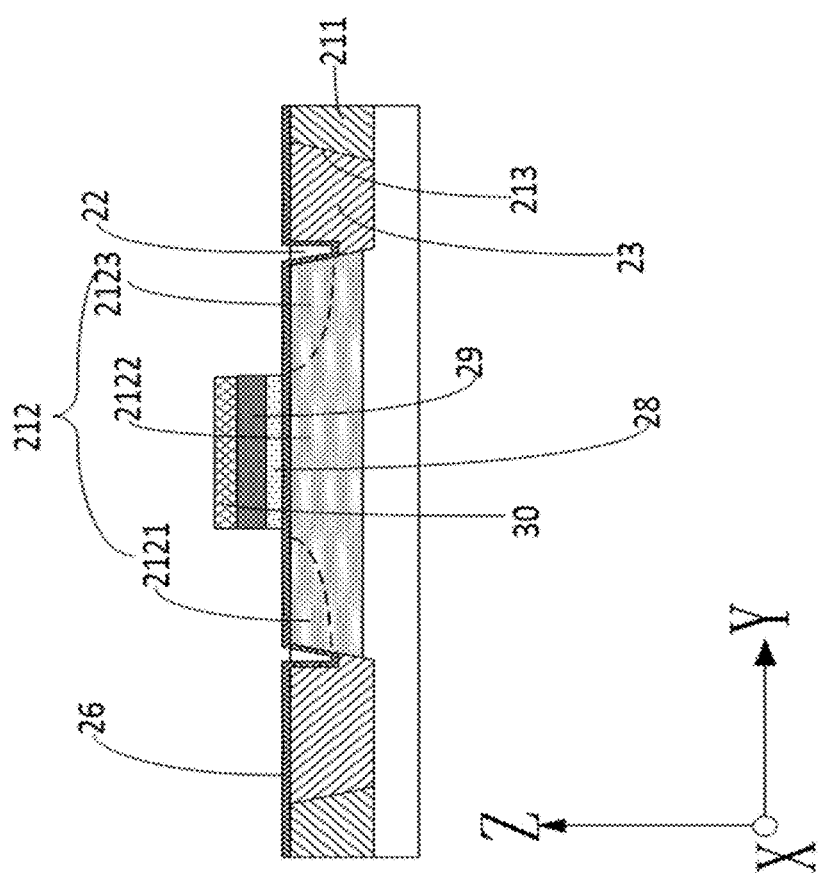
FIG. 27 is a structural view of a cross section taken along a line O-O' in FIG. 26.
Figure 28:
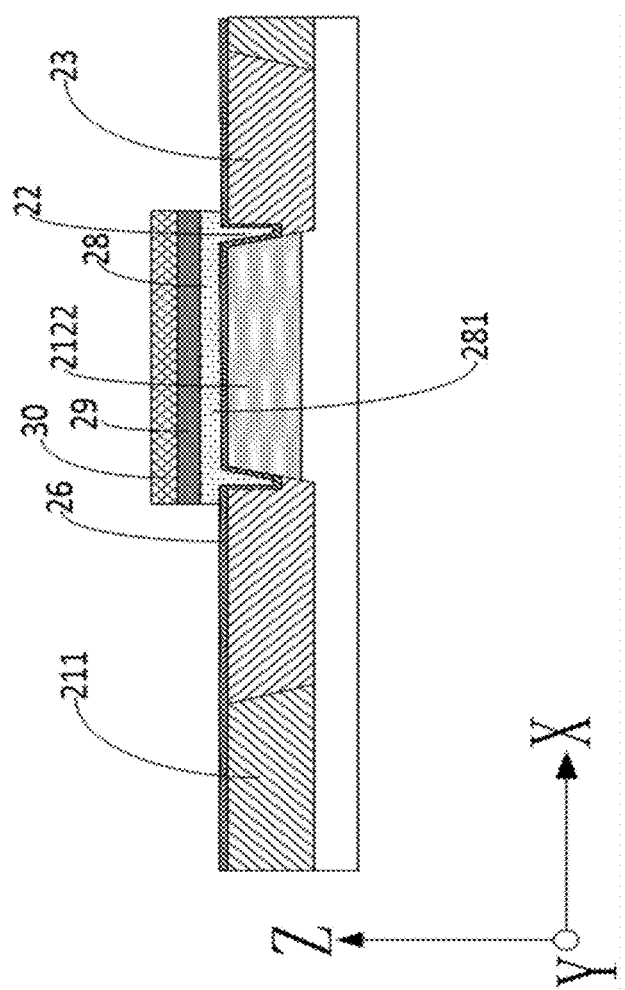
FIG. 28 is a structural view of a cross section taken along a line R-R' in FIG. 26.

A structural diagram after the completion of Step S1423 is as shown in FIGS. 26, 27 and 28.

Specifically, the gate material layer 27 located on the first source region 2121 and the first drain region 2123 may be removed by etching, and the gate material layer 27 located on the peripheries of the first source region 2121 and the first drain region 2123 may be removed by etching, to obtain the gate layer 28 having the first gate 281.

Figure 29:
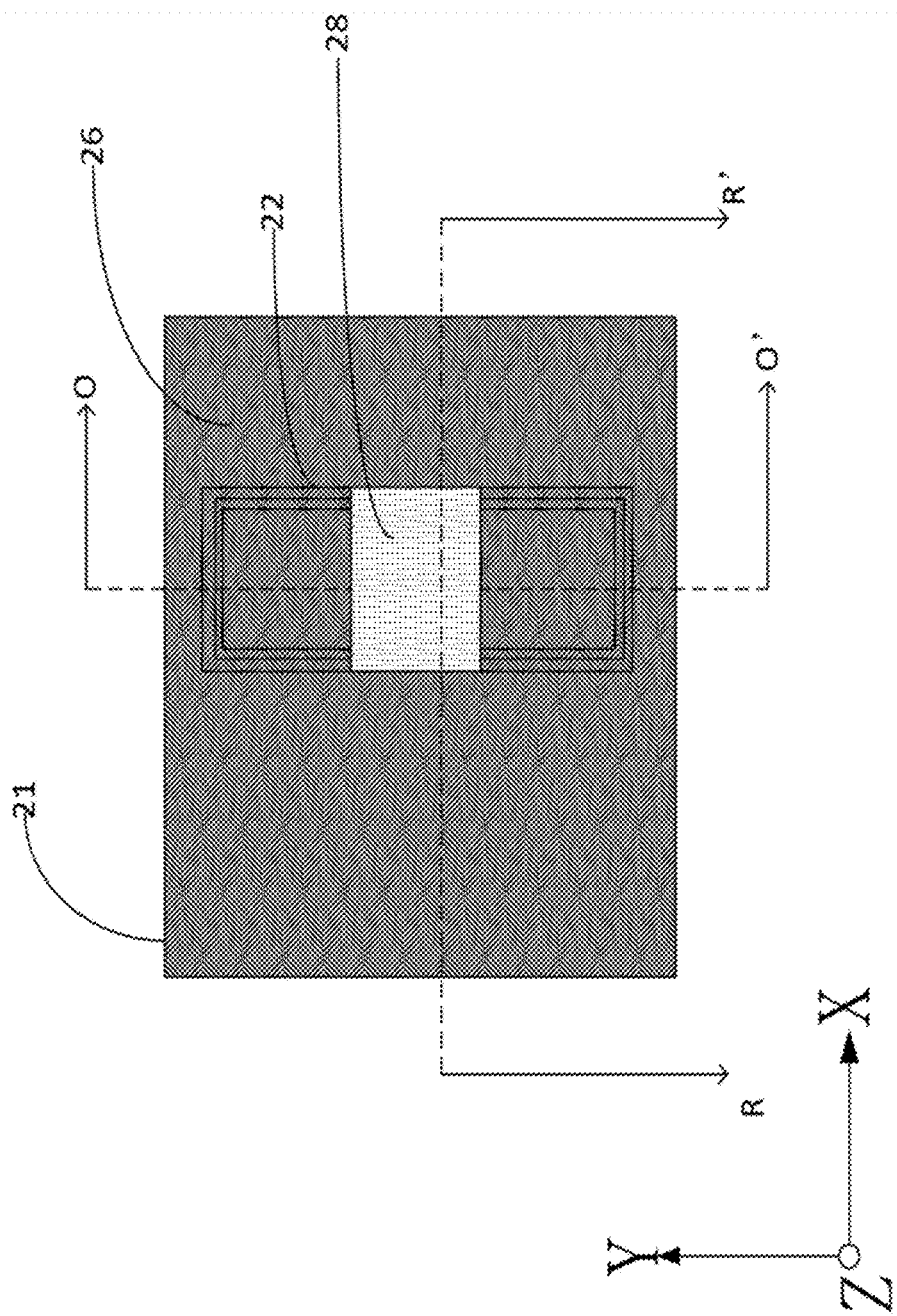
FIG. 29 is a top-down structural diagram after completion of Step S14, provided by embodiments of the present application.
Figure 30:
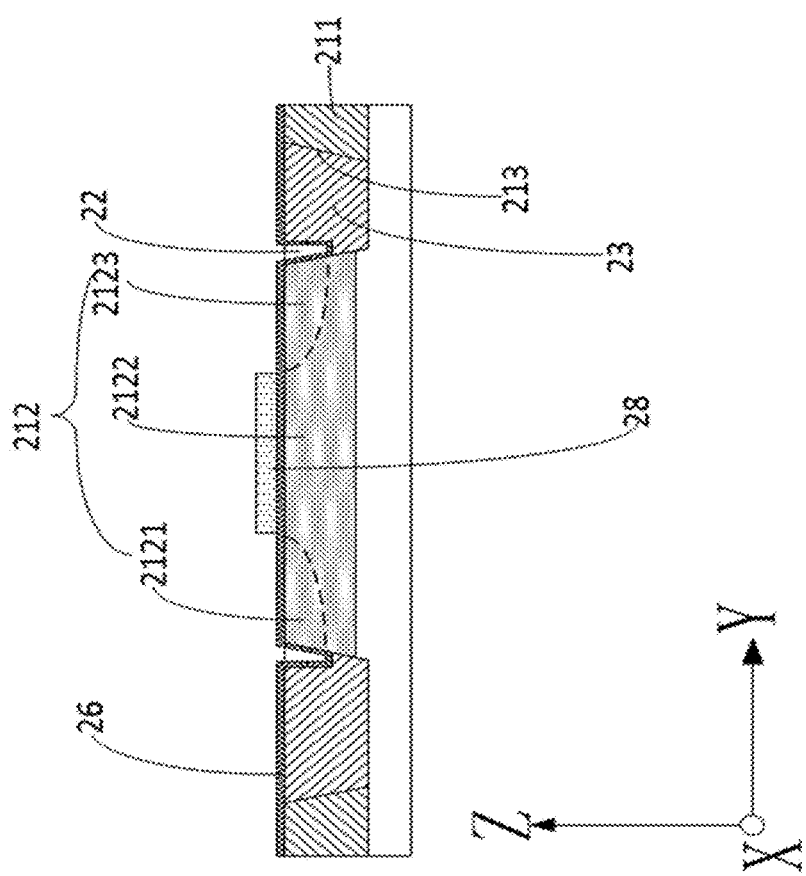
FIG. 30 is a structural view of a cross section taken along a line O-O' in FIG. 29.
Figure 31:
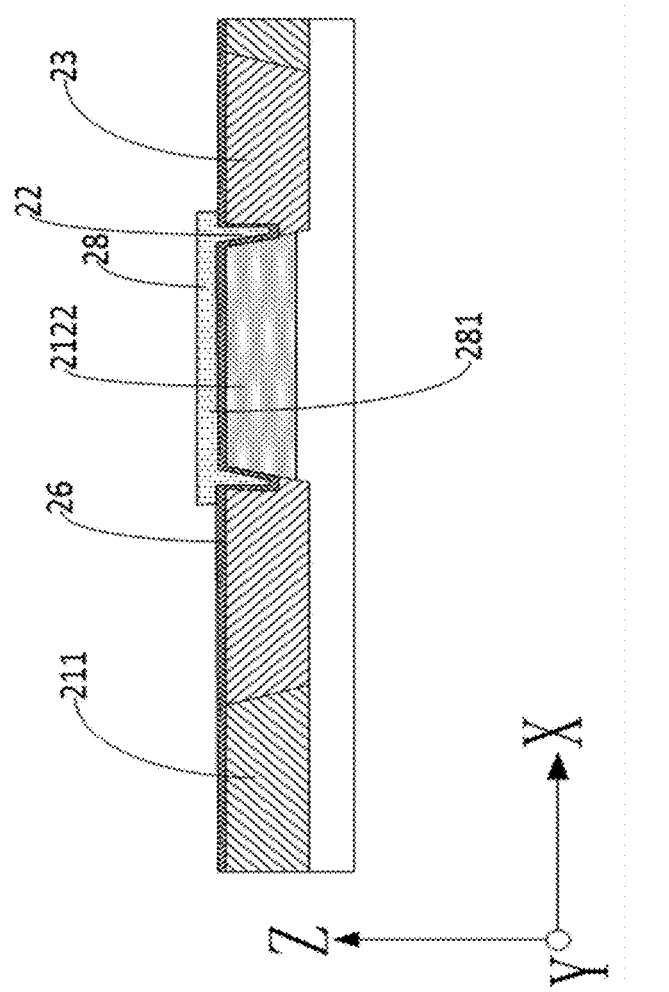
FIG. 31 is a structural view of a cross section taken along a line R-R' in FIG. 29.

It may be understood that, as shown in FIGS. 29, 30 and 31, the rest of the hard mask layer 29 and the photoresist layer 30 on the gate material layer 27 may be further removed after the gate material layer 27 is etched.

Specifically, the first gate 281 included in the gate layer 28 at least covers the first channel region 2122, and fills the first groove 22 located between the first channel region 2122 and the isolation region 211. Moreover, when the first groove 22 is formed between the first active region 212 and the isolation region 211 and surrounds the first active region 212, the first groove 22 between the first source region 2121 and the isolation region 211, and the first groove 22 between the first drain region 2123 and the isolation region 211 are not filled with the first gate 281. Meanwhile, the first gate 281 does not cover the top surfaces of the first source region 2121 and the first drain region 2123. Thus, the gate in the transistor subsequently formed on the basis of the first gate 281 and the first active region 212 may wrap up the channel on the two opposite side surfaces and the top surface of the channel. That is, it is equivalent to increase an effective length of the gate or the channel in the transistor, thereby being beneficial to improvement of performances of parameters, such as saturation current and leakage current, etc., of the transistor.

Moreover, during specific implementation, the first source region 2121, the first channel region 2122 and the first drain region 2123 in the first active region 212 may be distributed linearly in a first transverse direction Y parallel to the substrate 21, and two side ends of the first gate 281 in a second transverse direction X that is parallel to the substrate 21 and perpendicular to the first transverse direction Y may extend onto part of the isolation region 211 (e.g., part of the shallow trench isolation structure 23) on the two sides of the first channel region 2122.

In the above embodiment, the semiconductor device may comprise a plurality of transistors which may be classified into at least one transistor type (e.g., a high voltage transistor type, a low voltage transistor type and an ultra-low voltage transistor type, etc.) according to a working voltage (i.e., a gate pass voltage), wherein the gate pass voltage of the transistor of the high voltage transistor type is higher than that of the transistor of the low voltage transistor type, and the gate pass voltage of the transistor of the low voltage transistor type is higher than that of the transistor of the ultra-low voltage transistor type.

Specifically, the first active region 212 may be used to form a transistor of one of the transistor types (e.g., a transistor of the high voltage transistor type). That is, when there are a plurality of first active regions 212, a plurality of transistors formed on the basis of the plurality of first active regions 212 belong to the same transistor type. Moreover, during specific implementation, the plurality of transistors of the same transistor type may be simultaneously manufactured by Steps S11-S14, the plurality of transistors of the same transistor type may be also manufactured by Steps S11-S14 one by one or in multiple times.

Figure 32:
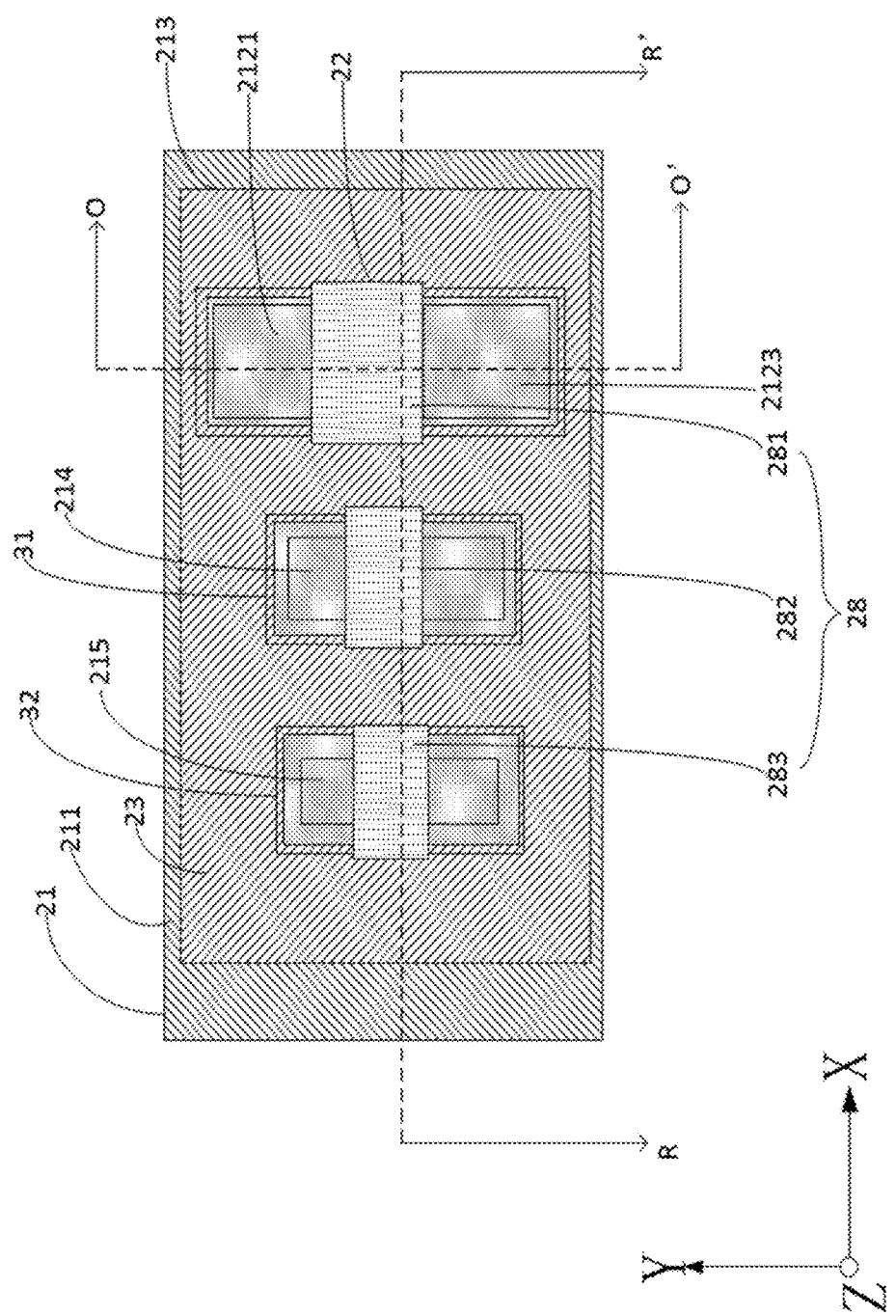
FIG. 32 is another top-down structural diagram after completion of Step S14, provided by embodiments of the present application.
Figure 33:
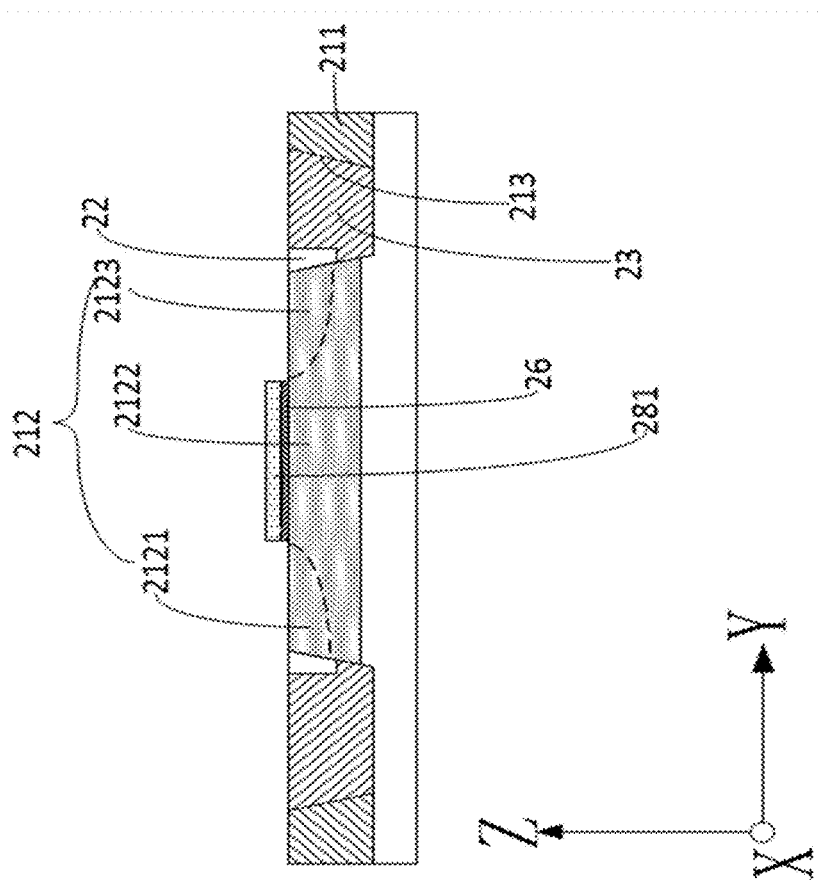
FIG. 33 is a structural view of a cross section taken along a line O-O' in FIG. 32.
Figure 34:
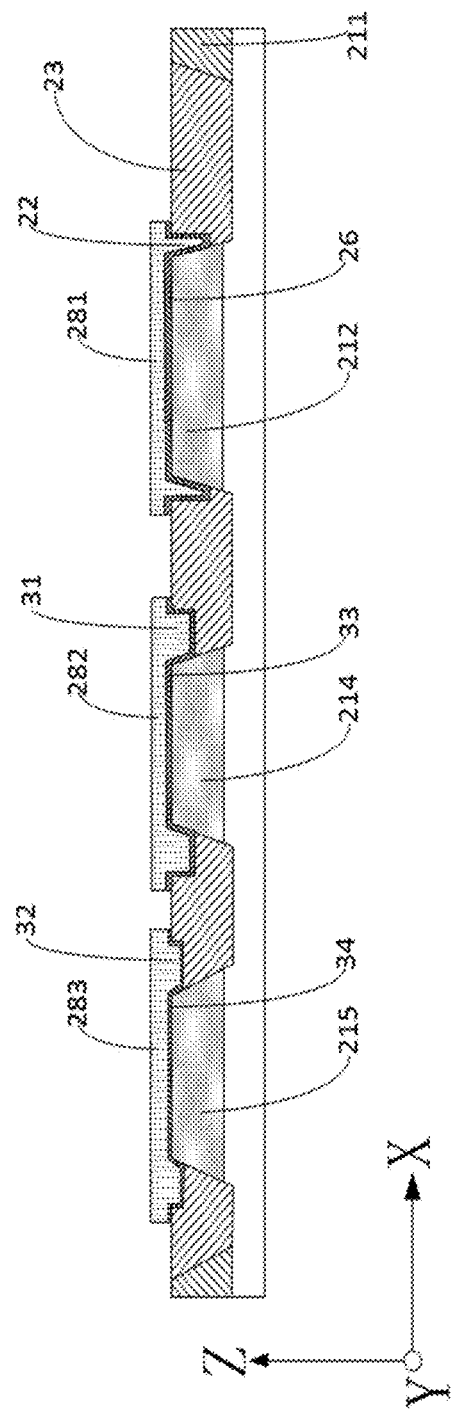
FIG. 34 is a structural view of a cross section taken along a line R-R' in FIG. 32.

In one specific embodiment, as shown in FIGS. 32, 33 and 34, the substrate 21 may further comprise a second active region 214 which is separated from the first active region 212 by the isolation region 211 and may comprise a second source region, a second channel region and a second drain region that are connected in sequence. It may be understood that, similar to the first active region 212, the second active region 214 may also correspondingly be an active region of one transistor in the semiconductor device, and the first active region 212 is distinct from the second active region 214 in that, in the semiconductor device, a transistor formed on the basis of the first active region 212 and a transistor formed on the basis of the second active region 214 belong to different transistor types, for example, the transistor formed on the basis of the first active region 212 may belong to the high voltage transistor type, while the transistor formed on the basis of the second active region 214 may belong to the low voltage transistor type.

Specifically, to form a corresponding transistor on the basis of the second active region 214, as shown in FIG. 10, before Step S14, the method may further comprise:

Step S15: a second groove is formed between the isolation region and the second channel region, the second groove is partially located in the isolation region and does not penetrate through the isolation region.

For specific implementations of Step S15, specific implementations of Step S12 may be referred to, and the specific implementations of Step S15 may be obtained only by replacing the first channel region and the first groove in the specific implementations of Step S12 with the second channel region and the second groove respectively. Thus, it is not described redundantly here.

Step S16: a second gate insulating layer covering the second groove and the second channel region is formed.

For specific implementations of Step S16, specific implementations of Step S13 may be referred to, and the specific implementations of Step S16 may be obtained only by replacing the first groove, first channel region and the first gate insulating layer in the specific implementations of Step S13 with the second groove, the second channel region and the second gate insulating layer respectively. Thus, it is not described redundantly here.

In another specific embodiment, as shown in FIGS. 32, 33 and 34, the substrate 21 may further comprise a third active region 215. The third active region 215, the first active region 212 and the second active region 214 are separated by the isolation region 211, and the third active region 215 may comprise a third source region, a third channel region and a third drain region that are connected in sequence. It may be understood that, similar to the first active region 212 and the second active region 214, the third active region 215 may correspondingly be an active region of one transistor in the semiconductor device, and is distinct from the first active region 212 and the second active region 214 in that, in the semiconductor device, a transistor formed on the basis of the third active region 215, a transistor formed on the basis of the first active region 212, and a transistor formed on the basis of the second active region 214 belong to different transistor types, for example, the transistor formed on the basis of the first active region 212 may belong to the high voltage transistor type, the transistor formed on the basis of the second active region 214 may belong to the low voltage transistor type, while the transistor formed on the basis of the third active region 215 may belong to the ultra-low voltage transistor type.

Specifically, to form a corresponding transistor on the basis of the third active region 215, as shown in FIG. 10, before Step S14, the method may further comprise:

Step S17: a third groove is formed between the isolation region and the third channel region, the third groove is partially located in the isolation region and does not penetrate through the isolation region.

For specific implementations of Step S17, specific implementations of Step S12 may be referred to, and the specific implementations of Step S17 may be obtained only by replacing the first channel region and the first groove in the specific implementations of Step S12 with the third channel region and the third groove respectively. Thus, it is not described redundantly here.

Step S18: a third gate insulating layer covering the third groove and the third channel region is formed.

For specific implementations of Step S18, specific implementations of Step S13 may be referred to, and the specific implementations of Step S18 may be obtained only by replacing the first groove, first channel region and the first gate insulating layer in the specific implementations of Step S13 with the third groove, the third channel region and the third gate insulating layer respectively. Thus, it is not described redundantly here.

In the above embodiment, to ensure that the transistor formed on the basis of the first active region 212 and the transistor formed on the basis of the second active region 214 belong to different transistor types, it may be set that, a depth of the second groove 31 in the longitudinal direction Z perpendicular to the substrate 21 is different from a depth of the first groove 22 in the longitudinal direction Z; and/or, a thickness of the second gate insulating layer 33 is different from a thickness of the first gate insulating layer 26.

In one possible embodiment, a gate pass voltage of the transistor formed on the basis of the first active region 212 may be higher than that of the transistor formed on the basis of the second active region 214. For example, the transistor formed on the basis of the first active region 212 may belong to the high voltage transistor type, the transistor formed on the basis of the second active region 214 may belong to the low voltage transistor type.

Accordingly, the depth of the second groove 31 in the longitudinal direction Z perpendicular to the substrate 21 may be less than the depth of the first groove 22 in the longitudinal direction Z. Moreover, in some embodiments, the thickness of the second gate insulating layer 33 may be less than the thickness of the first gate insulating layer 26.

By analogy, to ensure that the transistor formed on the basis of the third active region 215 and the transistor formed on the basis of the first active region 212 belong to different transistor types, it may be set that, a depth of the third groove 32 in the longitudinal direction Z perpendicular to the substrate 21 is different from the depth of the first groove 22 in the longitudinal direction Z. Moreover, in some embodiments, it may be set that, a thickness of the third gate insulating layer 34 is different from the thickness of the first gate insulating layer.

In other embodiments, to ensure that the transistor formed on the basis of the third active region 215 and the transistor formed on the basis of the second active region 214 belong to different transistor types, it may be set that, the depth of the third groove 32 in the longitudinal direction Z perpendicular to the substrate 21 is different from the depth of the second groove 31 in the longitudinal direction Z. Moreover, in some embodiments, it may be set that, the thickness of the third gate insulating layer 34 may be different from the thickness of the second gate insulating layer 33.

In one possible embodiment, the gate pass voltage of the transistor formed on the basis of the first active region 212 may be higher than that of the transistor formed on the basis of the second active region 214, the gate pass voltage of the transistor formed on the basis of the second active region 214 may be higher than that of the transistor formed on the basis of the third active region 215. For example, the transistor formed on the basis of the first active region 212 may belong to the high voltage transistor type, the transistor formed on the basis of the second active region 214 may belong to the low voltage transistor type, the transistor formed on the basis of the third active region 215 may belong to the ultra-low voltage transistor type.

Accordingly, the depth of the third groove 32 in the longitudinal direction Z perpendicular to the substrate 21 may be less than the depth of the second groove 31 in the longitudinal direction Z, the depth of the second groove 31 in the longitudinal direction Z perpendicular to the substrate 21 may be less than the depth of the first groove 22 in the longitudinal direction Z. Moreover, in some embodiments, the thickness of the third gate insulating layer 34 may be less than the thickness of the second gate insulating layer 33, the thickness of the second gate insulating layer 33 may be less than the thickness of the first gate insulating layer 26.

It should be noted that, for a transistor with a higher working voltage (i.e., gate pass voltage), its gate insulating layer is thicker, which is more beneficial to improvement of electrical characteristic parameters, such as saturation current, leakage current, etc., of a transistor device, thereby improving the performance of the transistor. Moreover, in the above embodiment, for the transistor with the high working voltage, the groove (i.e., the first groove 22, the second groove 31 or the third groove 32) between its channel and the isolation region 211 is deeper, which is more beneficial to improvement of control ability of the gate over the transistor channel, thereby improving the performance of the transistor.

In one possible embodiment, the depths of the first groove 22, the second groove 31 and the third groove 32 in the longitudinal direction Z perpendicular to the substrate 21 may be the same, and the first groove 22, the second groove 31 and the third groove 32 may be also formed by the same process (e.g., one etching process). That is, Steps S12, S15 and S17 may be the same etching process step, so that the first groove 22, the second groove 31 and the third groove 32 may be formed by one-step etching.

By analogy, in another possible embodiment, the first gate insulating layer 26, the second gate insulating layer 33 and the third gate insulating layer 34 have the same thickness, then the first gate insulating layer 26, the second gate insulating layer 33 and the third gate insulating layer 34 may be also formed in the same process (e.g., one deposition process). That is, Steps S13, S15 and S18 may be the same deposition process step, so that the first gate insulating layer 26, the second gate insulating layer 33 and the third gate insulating layer 34 may be formed by one-step deposition.

In other embodiments, when the first gate insulating layer 26, the second gate insulating layer 33 and the third gate insulating layer 34 have different thicknesses, the first gate insulating layer 26, the second gate insulating layer 33 and the third gate insulating layer 34 may be formed step by step in a gradual thickness decrease order. In the above embodiments, when the first groove 22, the second groove 31 and the third groove 32 have different depths, the first groove 22, the second groove 31 and the third groove 32 may be formed step by step in a gradual depth decrease order.

Specifically, for example, when the depths of the first groove 22, the second groove 31 and the third groove 32 decrease gradually, the first groove 22, the first gate insulating layer 26, the second groove 31, the second gate insulating layer 33, the third groove 32 and the third gate insulating layer 34 may be formed step by step by carrying out Steps S12, S13, S15, S16, S17 and S18 in sequence.

In the above embodiments, after Step S16, the method may further comprise:

S19: a second gate is formed on the second gate insulating layer, the second gate covers the second channel region and fills the second groove.

For specific implementations of Step S19, specific implementations of Step S14 may be referred to, and the specific implementations of Step S19 may be obtained only by replacing the first gate insulating layer, first channel region, the first groove and the first gate in the specific implementations of Step S14 with the second gate insulating layer, the second channel region, the second groove and the second gate respectively. Thus, it is not described redundantly here.

In some embodiments, after Step S18, the method may further comprise:

S20: a third gate is formed on the third gate insulating layer, the third gate covers the third channel region and fills the third groove.

For specific implementations of Step S20, specific implementations of Step S14 may be referred to, and the specific implementations of Step S20 may be obtained only by replacing the first gate insulating layer, first channel region, the first groove and the first gate in the specific implementations of Step S14 with the third gate insulating layer, the third channel region, the third groove and the third gate respectively. Thus, it is not described redundantly here.

Specifically, a structural diagram after the completion of Step S20 may be as shown in FIGS. 32, 33 and 34 where the first gate 281, the second gate 282 and the third gate 283 are disposed in an insulating manner at intervals. Moreover, during specific implementation, the gates (e.g., the first gate 281, the second gate 282 and the third gate 283) of the different transistors in the semiconductor device may be either formed by the same process (e.g., one etching process), or formed by multiple processes (e.g., multiple etching processes).

Specifically, for example, when the gates of the different transistors in the semiconductor device are formed by the same process, the first gate 281, the second gate 282 and the third gate 283 may be formed by the same process. That is, Steps S14, S19 and S20 may be the same process step, so that the gate layer 28 comprising the first gate 281, the second gate 282 and the third gate 283 may be formed by one process step.

Thus, the method for manufacturing the semiconductor device in this embodiment may be used to manufacture the transistors in which the gate insulating layers are different in thickness, and the transistors in which the grooves (e.g., the first groove 22, the second groove 31 and the third groove 32) between the channels and the isolation regions 211 are different in depth, thereby meeting diversified requirements of the transistors with different working voltages in the semiconductor device on the thickness of the gate insulating layer and on a contact area between the gate and the side surface of the channel.

In the above embodiments, the semiconductor device may be specifically a periphery circuit chip of a memory (e.g., a 3D NAND memory). A plurality of transistors may be integrated in the periphery circuit chip, and may belong to different transistor types.

In the above embodiments, as shown in FIG. 10, after Step S14, i.e., after forming the gate layer 28, the method for manufacturing the semiconductor device may further comprise:

Step S21: a sidewall is formed on a side surface of the first gate.

Figure 35:
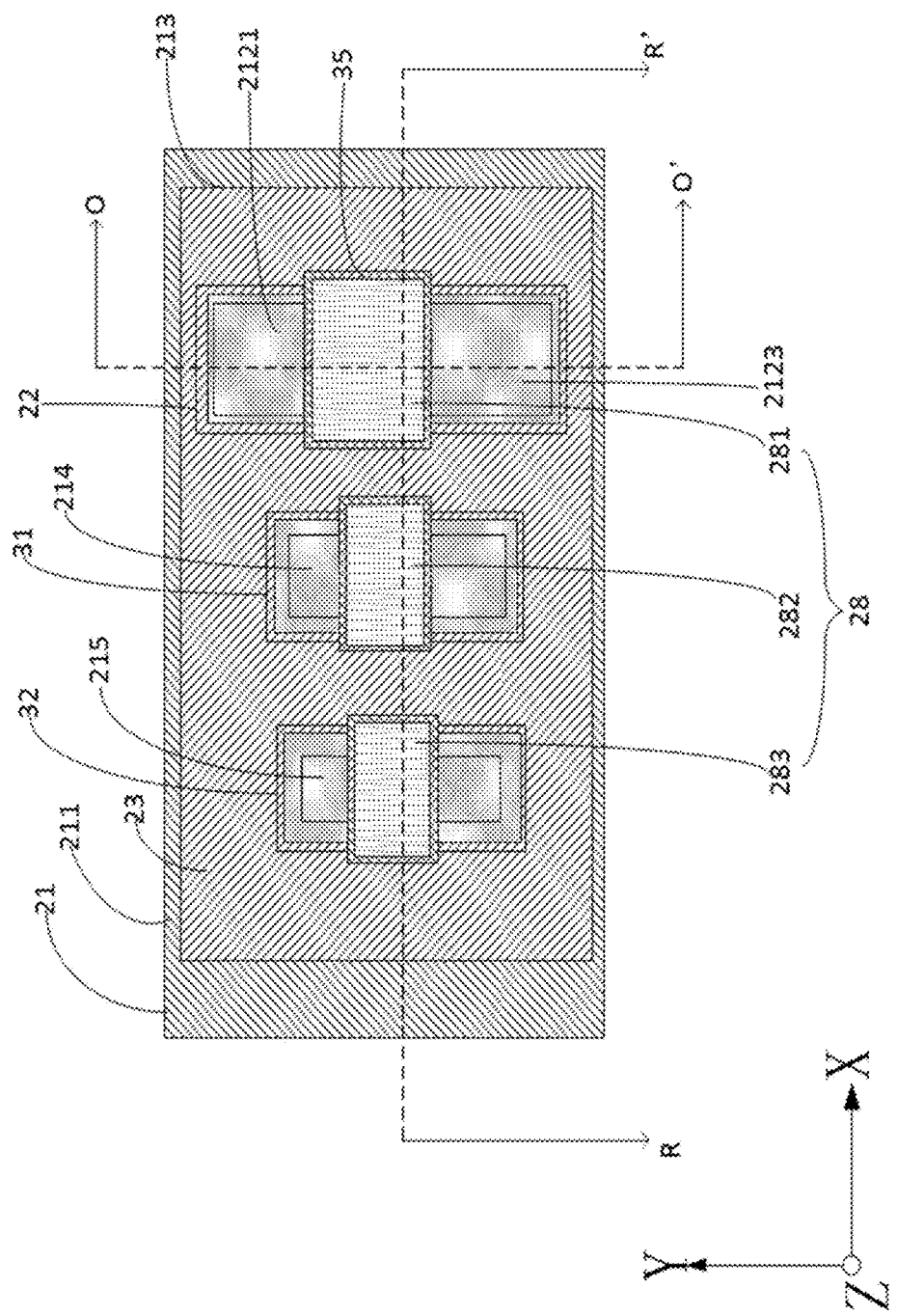
FIG. 35 is another top-down structural diagram after completion of Step S21, provided by embodiments of the present application.
Figure 36:
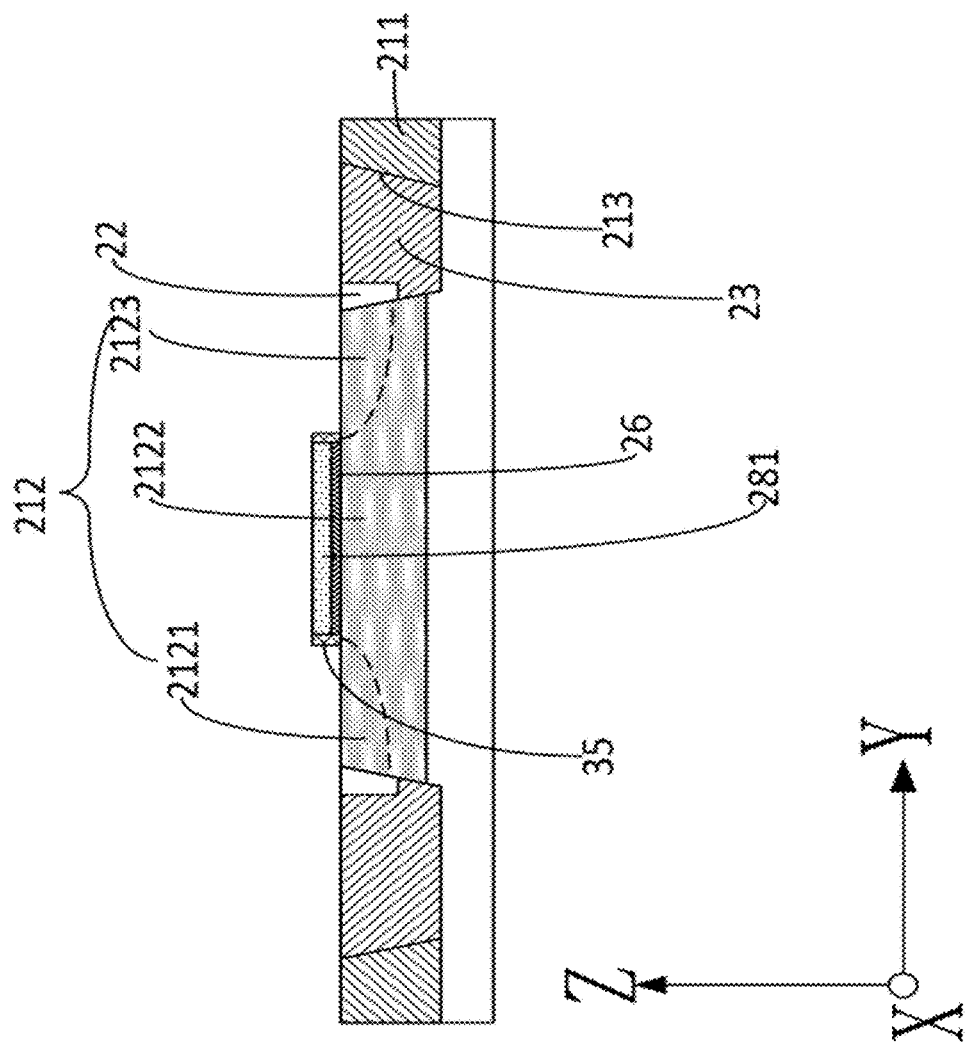
FIG. 36 is a structural view of a cross section taken along a line O-O' in FIG. 32.
Figure 37:
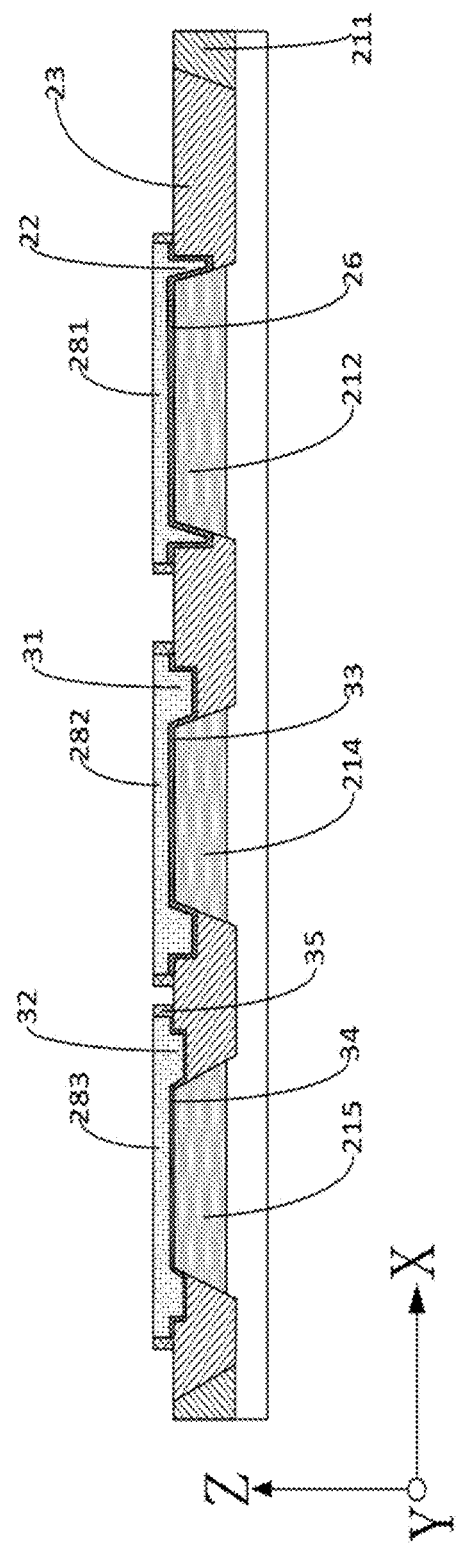
FIG. 37 is a structural view of a cross section taken along a line R-R' in FIG. 22.

A structural diagram after the completion of Step S21 is as shown in FIGS. 35, 36 and 37.

Specifically, the sidewall 35 may be formed on the side surfaces (e.g., four side surfaces, i.e., front, rear, left and right side surfaces) of the respective gates (e.g., the first gate 281, the second gate 281 and the third gate 281) of the gate layer 28 by sequentially using a deposition process and an etching process. A material of the sidewall 35 may be an insulating material, such as silicon oxide, etc., and the sidewall is used to protect the gate, and can reduce a hot carrier injection (HCI) effect.

In one specific embodiment, the semiconductor device may comprise a transistor of the high voltage transistor type, a transistor of the low voltage transistor type, and a transistor of the ultra-low voltage transistor type simultaneously, and a specific procedure for forming the semiconductor device may be as follows:

Step A: a substrate is formed, which comprises a first active region, a second active region, a third active region and an isolation region, the isolation region separates the first active region, the second active region and the third active region, and the first active region comprises a first source region, a first channel region and a first drain region that are connected in sequence, the second active region comprises a second source region, a second channel region and a second drain region that are connected in sequence, and the third active region comprises a third source region, a third channel region and a third drain region that are connected in sequence.

Step B: a first groove is formed between the isolation region and the first channel region, the first groove is partially located in the isolation region and does not penetrate through the isolation region.

Step C: a first gate insulating layer covering the first groove and the first channel region is formed.

Step D: a second groove is formed between the isolation region and the second channel region, the second groove is partially located in the isolation region and does not penetrate through the isolation region.

Step E: a second gate insulating layer covering the second groove and the second channel region is formed.

Step F: a third groove is formed between the isolation region and the third channel region, the third groove is partially located in the isolation region and does not penetrate through the isolation region.

Step G: a third gate insulating layer covering the third groove and the third channel region is formed.

Step H: a first gate is formed on the first gate insulating layer, a second gate is formed on the second gate insulating layer, and a third gate is formed on the third gate insulating layer, wherein the first gate covers the first channel region and fills the first groove; the second gate covers the second channel region and fills the second groove; the third gate covers the third channel region and fills the third groove.

Step I: sidewalls are formed on a side surface of the first gate, a side surface of the second gate, and a side surface of the third gate.

The first active region, the second active region and the third active region may have different sizes, for example, a cross-sectional area of the first active region, a cross-sectional area of the second active region and a cross-sectional area of the third active region may decrease in sequence.

The first groove, the second groove and the third groove may have different depths, for example, the depth of the first groove, the depth of the second groove and the depth of the third groove may decrease in sequence.

The first gate insulating layer, the second gate insulating layer and the third gate insulating layer may have different thicknesses, for example, the thickness of the first gate insulating layer, the thickness of the second gate insulating layer and the thickness of the third gate insulating layer may decrease in sequence.

It may be understood that, for specific implementations of Step A, specific implementations of Step S11 may be referred to; for specific implementations of Step B, specific implementations of Step S12 may be referred to; for specific implementations of Step C, specific implementations of Step S13 may be referred to; for specific implementations of Step D, specific implementations of Step S15 may be referred to; for specific implementations of Step E, specific implementations of Step S16 may be referred to; for specific implementations of Step F, specific implementations of Step S17 may be referred to; for specific implementations of Step G, specific implementations of Step S18 may be referred to; for specific implementations of Step H, specific implementations of Steps S14, S19 and S20 may be referred to; for specific implementations of Step I, specific implementations of Step S21 may be referred to. Thus, they are not described redundantly here.

The method for manufacturing the semiconductor device provided by this embodiment, by forming a substrate that comprises a first active region and an isolation region located on a periphery of the first active region, the first active region comprising a first source region, a first channel region and a first drain region that are connected in sequence, forming a first groove between the isolation region and the first channel region, the first groove being partially located in the isolation region and not penetrating through the isolation region, then forming a first gate insulating layer covering the first groove and the first channel region, and forming a first gate on the first gate insulating layer, the first gate covering the first channel region and filling the first groove, can increase effective lengths of the gates to improve the control of the gate over transistor channel, and can improve the electrical characteristic parameters, such as saturation current, leakage current, etc., of a transistor device and the performance of the transistor device while the size of the transistor device is reduced.

A semiconductor device manufactured according to the above method embodiments of the present application is as shown in FIGS. 29, 30 and 31. The semiconductor device comprises: a substrate 21 comprising a first active region 212 and an isolation region 211 located on a periphery of the first active region 212, the first active region 212 comprises a first source region 2121, a first channel region 2122 and a first drain region 2123 that are connected in sequence; a first groove 22 located between the isolation region 211 and the first channel region 2122, the first groove 22 is partially located in the isolation region 211 and does not run penetrate the isolation region 211; a first gate insulating layer 26 covering the first groove 22 and the first channel region 2122; and a first gate 281 located on the first gate insulating layer 26, the first gate 281 covers the first channel region 2122 and fills the first groove 22.

In one specific embodiment, the first groove 22 may be located between the isolation region 211 and the first active region 212 and surround the first active region 212.

In one specific embodiment, as shown in FIGS. 32, 33 and 34, the substrate 21 may further comprise a second active region 214, the first active region 212 and the second active region 214 are separated by the isolation region 211, and the second active region 214 may comprise a second source region, a second channel region and a second drain region that are connected in sequence.

Specifically, the semiconductor device may further comprise a second groove 31 located between the isolation region 211 and the second channel region, the second groove 31 is partially located in the isolation region 211 and does not penetrate through the isolation region 211. Further, the semiconductor device may also comprise a second gate insulating layer 33 covering the second groove 31 and the second channel region. A thickness of the second gate insulating layer 33 is different from a thickness of the first gate insulating layer 26, for example, the thickness of the second gate insulating layer 33 may be less than the thickness of the first gate insulating layer 26.

In one specific embodiment, the semiconductor device may further comprise a second gate 282 that covers the second channel region and fills the second groove 31 located between the isolation region 211 and the second channel region.

A depth of the second groove 31 in a longitudinal direction Z perpendicular to the substrate 21 is less than a depth of the first groove 22 in the longitudinal direction Z.

In some embodiments, the substrate 21 may further comprise a shallow trench that is disposed in the isolation region 211 and located on a periphery of the first active region. The semiconductor device may further comprise a shallow trench isolation structure located in the shallow trench. The first groove 22 may be specifically located between the shallow trench isolation structure and the first channel region, and a depth of the first groove 22 in the longitudinal direction Z perpendicular to the substrate 21 may be less than a depth of the shallow trench isolation structure in the longitudinal direction Z.

In some embodiments, the semiconductor device may further comprise a sidewall disposed on a side surface of the first gate 281.

It should be noted that, for respective structures of the semiconductor device in this embodiment, the specific implementations as described in the above method embodiments may be referred to. Thus, it is not described redundantly here.

The semiconductor device provided by this embodiment improves the control of the gates over transistor channels by increasing effective lengths of the gates, and therefore, can improve the electrical characteristic parameters of a transistor device, such as saturation current, leakage current, etc., of a transistor device and the performance of the transistor device while the size of the transistor device is reduced.

Figure 38:
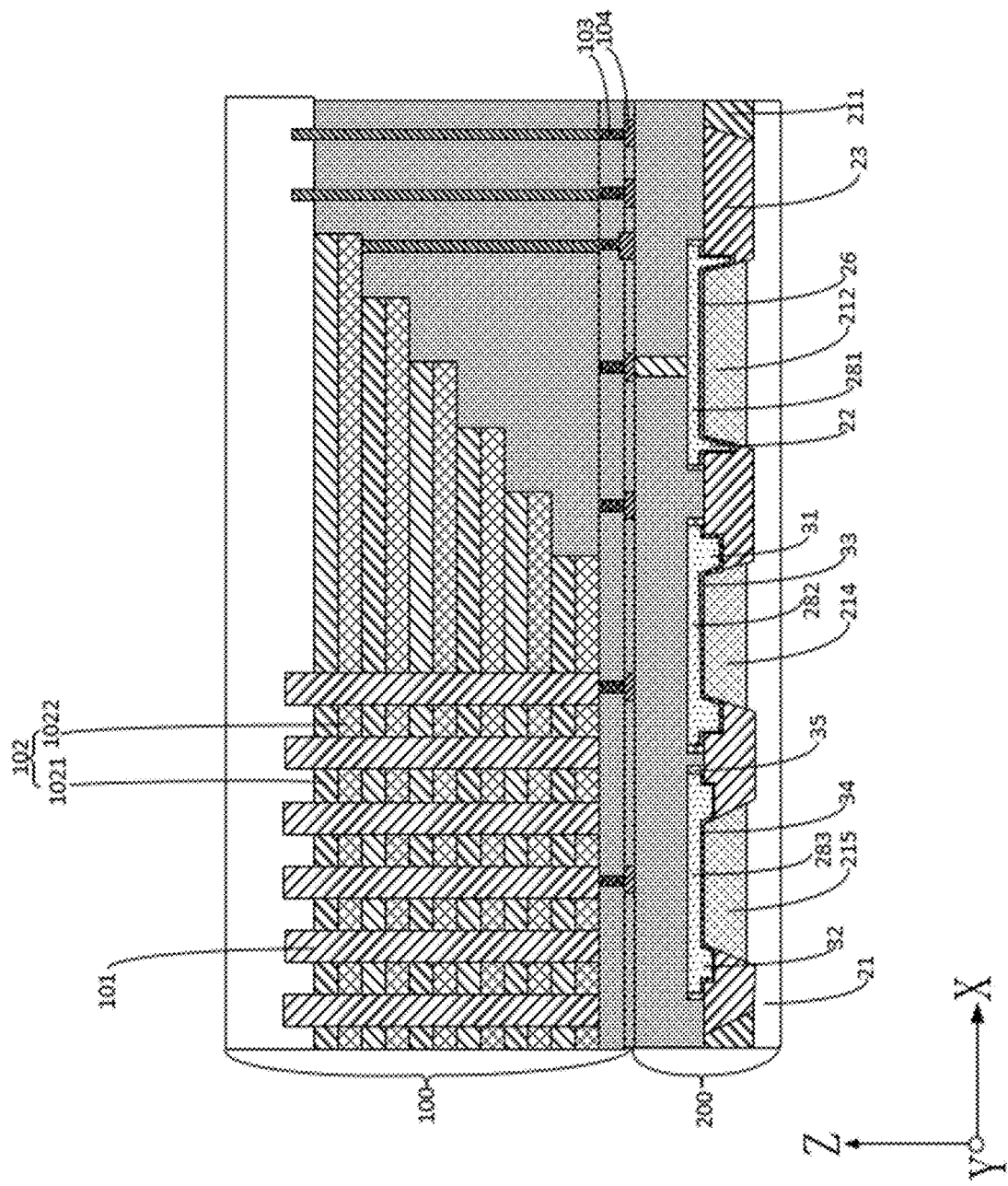
FIG. 38 is a cross-sectional structural diagram of a NAND memory device provided by embodiments of the present application.

Referring to FIG. 38, FIG. 38 is a structural diagram of a NAND memory device provided by embodiments of the present application. As shown in FIG. 38, the NAND memory device may comprise a memory array 100 and a periphery device 200 that are electrically connected, wherein the memory array 100 may comprise a plurality of memory cell strings 101, and the periphery device 200 may comprise a semiconductor device of any one of the above embodiments.

Specifically, the periphery device 200 may comprise: a substrate 21 that comprises a first active region 212 and an isolation region 211 located on a periphery of the first active region 212, the first active region 212 comprises a first source region, a first channel region and a first drain region that are connected in sequence; a first groove 22 located between the isolation region 211 and the first channel region, the first groove 22 is partially located in the isolation region 211 and does not penetrate through the isolation region 211; a first gate insulating layer 26 covering the first groove 22 and the first channel region 2122; and a first gate 281 located on the first gate insulating layer 26, the first gate 281 covers the first channel region 2122 and fills the first groove 22.

In one specific embodiment, the first groove 22 may be located between the isolation region 211 and the first active region 212 and surround the first active region 212.

In one specific embodiment, the substrate 21 may further comprise a second active region 214, the first active region 212 and the second active region 214 are separated by the isolation region 211, and the second active region 214 comprises a second source region, a second channel region and a second drain region that are connected in sequence.

Specifically, the periphery device 200 may further comprise a second groove 31 located between the isolation region 211 and the second channel region, the second groove 31 is partially located in the isolation region 211 and does not penetrate through the isolation region 211. Further, the periphery device 200 may also comprise a second gate insulating layer 33 covering the second groove 31 and the second channel region. A thickness of the second gate insulating layer 33 is different from a thickness of the first gate insulating layer 26, for example, the thickness of the second gate insulating layer 33 may be less than the thickness of the first gate insulating layer 26.

In one specific embodiment, the periphery device 200 may further comprise a second gate 282 that covers the second channel region and fills the second groove 31 located between the isolation region 211 and the second channel region.

A depth of the second groove 31 in a longitudinal direction Z perpendicular to the substrate 21 is less than a depth of the first groove 22 in the longitudinal direction Z.

In some embodiments, the substrate 21 may further comprise a shallow trench that is disposed in the isolation region 211 and located on a periphery of the first active region 212. The periphery device 200 may further comprise a shallow trench isolation structure 23 located in the shallow trench. The first groove 22 may be specifically located between the shallow trench isolation structure 23 and the first channel region, and a depth of the first groove 22 in the longitudinal direction Z perpendicular to the substrate 21 may be less than a depth of the shallow trench isolation structure 23 in the longitudinal direction Z.

In some embodiments, the periphery device 200 may further comprise a sidewall 35 disposed on a side surface of the first gate 281.

It should be noted that, for respective structures of the periphery device 200 in this embodiment, the specific implementations as described in the above semiconductor device embodiments may be referred to. Thus, it is not described redundantly here.

In the above embodiments, the memory array 100 may further comprise a stack structure 102 located on the periphery device 200, wherein each memory cell string 101 comprises a channel layer and a memory functional layer that penetrate through the stack structure 102, and the memory functional layer is located between the channel layer and the stack structure. The stack structure 102 may comprise a number of gate layers 1021 and gate insulating layers 1022 which are disposed in an alternate stack-up manner in the longitudinal direction Z.

In some specific embodiments, the memory array 100 may further comprise an interconnection layer 104 disposed on one side of the stack structure 102 facing toward the periphery device 200, wherein the memory cell strings 101 are electrically connected with the interconnection layer 104, and the interconnection layer 104 may be electrically connected to the substrate 21 in the first source region, the substrate 21 in the first drain region and/or the first gate 281 of the periphery device 200.

Specifically, the memory array 100 may further comprise an interlayer dielectric layer disposed between the stack structure 102 and the interconnection layer 104, and a plurality of electrically conductive contacts 103 formed in the interlayer dielectric layer. The plurality of electrically conductive contacts 103 may comprise bit line contacts which can extend in the longitudinal direction Z, one end of the bit line contacts is electrically connected with the memory cell strings 101, and the other end of the bit line contacts is electrically connected with the interconnection layer 104.

It may be understood that, for specific implementations of the memory array 100 in this embodiment, specific implementations of a memory array in the other embodiments may be referred to. Thus, it is not described redundantly here.

Moreover, although the NAND memory device as exemplified in this embodiment takes a wafer bonding architecture for bonding of the periphery device and the memory array as an example, the NAND memory device may be other possible NAND architectures, (e.g., a periphery under core array (PUC) architecture, a periphery near core array (PNC) architecture, etc) in other embodiments. The embodiments of the present application do not make specific restrictions to this.

The NAND memory device provided by this embodiment improves the control of the gates over transistor channels by increasing effective lengths of the gates, and therefore, can improve the electrical characteristic parameters, such as saturation current, leakage current, etc., of a transistor device and the performance of the transistor device while the size of the transistor device is reduced.

The above mentioned are merely preferred embodiments of the present application and are not used for limiting the present application. Any modification, equivalent replacement, improvement and the like, within the spirits and principles of the present application, shall fall in the protection scope of the present application.

What is claimed is:

1. A semiconductor device, comprising:
    a substrate comprising a first active region, a second active region, and an isolation region surrounding the first active region, the first active region comprising a first channel region sandwiched between a first source region and a first drain region in a lateral direction, the first active region and the second active region are separated by the isolation region, and the second active region comprising a second channel region sandwiched between a second source region and a second drain region in the lateral direction;
    a first groove located between the isolation region and the first channel region, the first groove being partially located in the isolation region without penetrating the isolation region;
    a second groove located between the isolation region and the second channel region, the second groove being partially located in the isolation region without penetrating the isolation region;
    a first gate insulating layer covering the first groove and the first channel region;
    a second gate insulating layer covering the second groove and the second channel region, a thickness of the second gate insulating layer being different from a thickness of the first gate insulating layer; and
    a first gate located on the first gate insulating layer, and covering the first channel region and filling the first groove.

2. The semiconductor device of claim 1, wherein the first groove further surrounds the first active region.

3. The semiconductor device of claim 1, wherein the semiconductor device further comprises a second gate that covers the second channel region and fills the second groove.

4. The semiconductor device of claim 1, wherein a depth of the second groove in a longitudinal direction perpendicular to a top surface of the substrate is less than a depth of the first groove in the longitudinal direction.

5. A NAND memory device, comprising:
    a memory array comprising a plurality of memory cell strings; and
    a periphery device electrically connected with the memory array, comprising:
        a substrate comprising a first active region, a second active region, and an isolation region separating the first active region and the second active region, the first active region comprising a first channel region sandwiched between a first source region and a first drain region in a lateral direction, and the second active region comprising a second channel region sandwiched between a second source region and a second drain region in the lateral direction,
        a first groove located between the isolation region and the first channel region, the first groove being partially located in the isolation region without penetrating the isolation region,
        a second groove located between the isolation region and the second channel region, the second groove being partially located in the isolation region without penetrating the isolation region,
        a first gate insulating layer covering the first groove and the first channel region,
        a second gate insulating layer covering the second groove and the second channel region, a thickness of the second gate insulating layer being different from a thickness of the first gate insulating layer, and
        a first gate located on the first gate insulating layer, the first gate covering the first channel region and filling the first groove.

6. The NAND memory device of claim 5, wherein the first groove further surrounds the first active region.

7. The NAND memory device of claim 5, wherein the periphery device further comprises a second gate that covers the second channel region and fills the second groove.

8. The NAND memory device of claim 5, wherein a depth of the second groove in a longitudinal direction perpendicular to a top surface of the substrate is less than a depth of the first groove in the longitudinal direction.

9. The NAND memory device of claim 5, wherein the memory array further comprises:
    a stack structure located on the periphery device, wherein each of the memory cell strings comprises a channel layer and a memory functional layer penetrating through the stack structure, and the memory functional layer is located between the channel layer and the stack structure.

10. The NAND memory device of claim 9, wherein the memory array further comprises:
    an interconnection layer disposed on one side of the stack structure facing toward the periphery device, wherein the memory cell strings are electrically connected with the peripheral device through the interconnection layer.

11. A semiconductor device, comprising:
    a substrate comprising a first active region, a second active region, and an isolation region between the first active region and the second active region, the first active region comprising a first channel region, and the second active region comprising a second channel region;
    a first groove located between the isolation region and the first channel region;

a second groove located between the isolation region and the second channel region;

a first gate insulating layer covering the first groove and the first channel region;

a second gate insulating layer covering the second groove and the second channel region, a thickness of the second gate insulating layer being different from a thickness of the first gate insulating layer; and a first gate located on the first gate insulating layer, comprising a first lateral portion covering the first channel region and a first extended portion in the first groove; and a second gate located on the second gate insulating layer, comprising a second lateral portion covering the second channel region and a second extended portion in the second groove.

12. The semiconductor device of claim 11, wherein:
the first groove is partially located in the isolation region without penetrating the isolation region; and
the second groove is partially located in the isolation region without penetrating the isolation region.

13. The semiconductor device of claim 11, wherein the isolation region surrounds the first active region and the second active region.

14. The semiconductor device of claim 11, wherein:
the first groove surrounds the first active region; and
the second groove surrounds the second active region.

15. The semiconductor device of claim 11, wherein a depth of the second groove in a vertical direction perpendicular to a top surface of the substrate is less than a depth of the first groove in the vertical direction.

16. The semiconductor device of claim 15, wherein:
a depth of the isolation region in the vertical direction is greater than a first depth of the first active region and a second depth of the second active region.

17. The semiconductor device of claim 11, further comprising a memory array comprising a plurality of memory cell strings, wherein the first gate and the second gate are coupled with the memory array.

18. The semiconductor device of claim 17, wherein the memory array further comprises:
a stack structure, wherein each of the memory cell strings comprises a channel layer and a memory functional layer penetrating through the stack structure, and the memory functional layer is located between the channel layer and the stack structure.

19. The semiconductor device of claim 18, wherein the memory array further comprises:
an interconnection layer between the stack structure and the first gate and the second gate, wherein the memory cell strings are electrically connected with the first gate and the second gate through the interconnection layer.

20. The semiconductor device of claim 11, wherein:
the first gate at partially covers the first channel region from three directions; and
the second gate at partially covers the second channel region from three directions.

* * * * *